United States Patent
Sze et al.

(10) Patent No.: US 11,855,237 B2
(45) Date of Patent: Dec. 26, 2023

(54) GERMANIUM-BASED SENSOR WITH JUNCTION-GATE FIELD EFFECT TRANSISTOR AND METHOD OF FABRICATING THEREOF

(71) Applicant: Taiwan Semiconductor Manufacturing Company, Ltd., Hsin-Chu (TW)

(72) Inventors: Jhy-Jyi Sze, Hsin-Chu (TW); Sin-Yi Jiang, Hsinchu (TW); Yi-Shin Chu, Hsinchu (TW); Yin-Kai Liao, Taipei (TW); Hsiang-Lin Chen, Hsinchu (TW); Kuan-Chieh Huang, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/151,828

(22) Filed: Jan. 9, 2023

(65) Prior Publication Data
US 2023/0163231 A1     May 25, 2023

Related U.S. Application Data

(63) Continuation of application No. 17/383,687, filed on Jul. 23, 2021.
(Continued)

(51) Int. Cl.
*H01L 31/112*      (2006.01)
*H01L 31/18*      (2006.01)
(Continued)

(52) U.S. Cl.
CPC .... *H01L 31/1129* (2013.01); *H01L 27/14679* (2013.01); *H01L 29/66893* (2013.01);
(Continued)

(58) Field of Classification Search
CPC .......... H01L 31/1129; H01L 27/14679; H01L 29/66893; H01L 29/808; H01L 31/112;
(Continued)

(56) References Cited

U.S. PATENT DOCUMENTS 5,907,168 A * 5/1999 Childs ................. H01L 29/1066
                                                                                                  257/256
10,062,694 B2 * 8/2018 Ando ..................... H01L 27/092
(Continued)

OTHER PUBLICATIONS

D. Van Nieuwenhove et al., "Time-of-Flight Optical Ranging Sensor Based on a Current Assisted Photonic Demodulator", Proc. Symp IEEE/LEOS Benelux Chapter, 2006, Eindhoven.

*Primary Examiner* — Earl N Taylor
(74) *Attorney, Agent, or Firm* — HAYNES AND BOONE, LLP

(57) ABSTRACT

Germanium-based sensors are disclosed herein. An exemplary germanium-based sensor includes a germanium photodiode and a junction field effect transistor (JFET) formed from a germanium layer disposed on and/or in a silicon substrate. A doped silicon layer, which can be formed by in-situ doping epitaxially grown silicon, is disposed between the germanium layer and the silicon substrate. In embodiments where the germanium layer is on the silicon substrate, the doped silicon layer is disposed between the germanium layer and an oxide layer. The JFET has a doped polysilicon gate, and in some embodiments, a gate diffusion region is disposed in the germanium layer under the doped polysilicon gate. In some embodiments, a pinned photodiode passivation layer is disposed in the germanium layer. In some embodiments, a pair of doped regions in the germanium layer is configured as an e-lens of the germanium-based sensor.

20 Claims, 25 Drawing Sheets

Related U.S. Application Data

(60) Provisional application No. 63/161,287, filed on Mar. 16, 2021.

(51) Int. Cl.
  *H01L 27/146* (2006.01)
  *H01L 29/808* (2006.01)
  *H01L 29/10* (2006.01)
  *H01L 29/66* (2006.01)

(52) U.S. Cl.
  CPC .......... *H01L 29/808* (2013.01); *H01L 31/112* (2013.01); *H01L 31/1804* (2013.01); *H01L 31/1864* (2013.01); *H01L 29/1066* (2013.01)

(58) Field of Classification Search
  CPC ............. H01L 31/1804; H01L 31/1864; H01L 29/1066
  See application file for complete search history.

(56) References Cited

U.S. PATENT DOCUMENTS

| | | | |
|---|---|---|---|
| 11,393,939 B2* | 7/2022 | Chern | H01L 31/105 |
| 11,393,940 B2* | 7/2022 | Chern | H01L 31/1804 |
| 11,404,590 B2* | 8/2022 | Chern | H01L 31/1804 |
| 2007/0284628 A1* | 12/2007 | Kapoor | H01L 29/41775 |
| | | | 257/E21.446 |
| 2008/0272394 A1* | 11/2008 | Kapoor | H01L 29/1066 |
| | | | 257/190 |
| 2009/0017585 A1* | 1/2009 | Kapoor | H01L 29/41775 |
| | | | 257/E21.446 |
| 2010/0006961 A1* | 1/2010 | Yasaitis | H01L 31/18 |
| | | | 257/431 |
| 2010/0151619 A1* | 6/2010 | Yasaitis | H01L 27/1443 |
| | | | 438/93 |
| 2015/0016769 A1* | 1/2015 | Verma | G02B 6/12004 |
| | | | 438/69 |
| 2018/0233528 A1* | 8/2018 | Na | H01L 31/0376 |
| 2022/0302336 A1 | 9/2022 | Sze et al. | |

* cited by examiner

GERMANIUM-BASED SENSOR WITH JUNCTION-GATE FIELD EFFECT TRANSISTOR AND METHOD OF FABRICATING THEREOF

This application is a continuation application of U.S. patent application Ser. No. 17/383,687, filed Jul. 23, 2021, which is a non-provisional application of and claims benefit of U.S. Provisional Patent Application Ser. No. 63/161,687, filed Mar. 16, 2021, the entire disclosures of which are incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process, such that realizing continued advances in ICs calls for similar advances in semiconductor manufacturing processes and technology.

As one example, semiconductor sensors are widely used for a variety of applications to measure physical, chemical, biological, and/or environmental parameters. Some specific types of semiconductor sensors include gas sensors, pressure sensors, temperature sensors, and optical image sensors, among others. For optical image sensors, dark current is a major concern for performance and reliability. Dark current, which is current that flows in the absence of light, can more generally be described as leakage current present in an optical image sensor. In at least some cases, poor quality of interfaces between various semiconductor layers used in optical image sensors and/or poor quality of surfaces of the various semiconductor layers may result in significant dark current. Another major concern for performance and/or reliability of optical image sensors is optical fill factor, which generally indicates a ratio of a light sensitive area of a pixel (e.g., a photodiode area) ratio to a total area of the pixel. Although existing optical image sensors and methods for fabricating such have been generally adequate for their intended purpose, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1J are diagrammatic cross-sectional views of a photosensitive device, such as a germanium-based sensor with junction-gate field effect transistor, in portion or entirety, at various fabrication stages according to various aspects of the present disclosure.

DETAILED DESCRIPTION

Figure 1A:
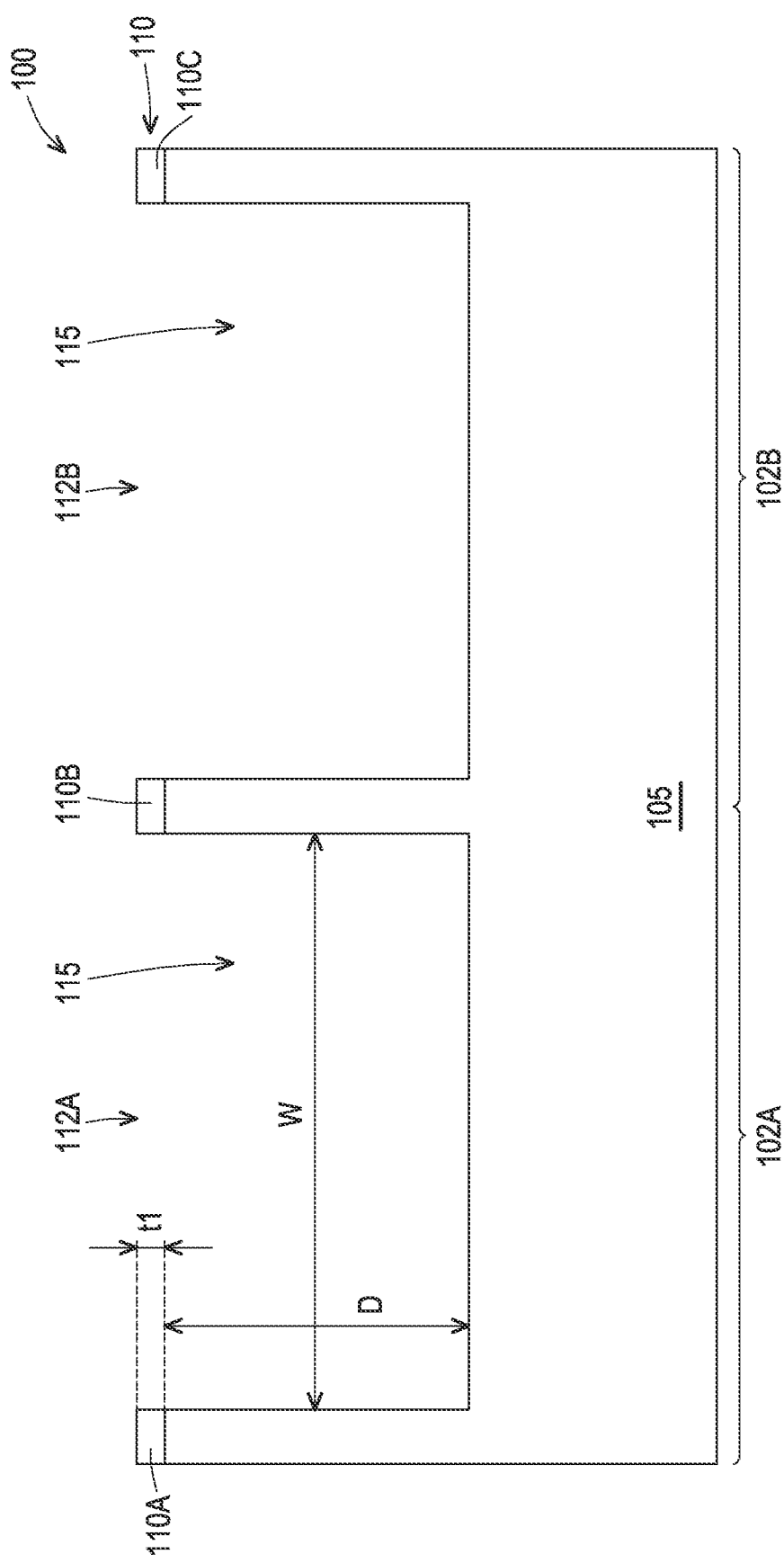

The present disclosure relates generally to photosensitive devices, and more particularly to, germanium-based photosensitive devices and methods of fabrication thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of description of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure provides germanium-based photosensitive devices and methods of fabrication thereof. The disclosed germanium-based photosensitive devices can reduce leakage current and/or dark current from germanium photodiodes, improve optical fill factor, improve conversion gain, and/or reduce noise. An exemplary germanium-based sensor includes a germanium photodiode and a junction field effect transistor (JFET) formed from a germanium layer disposed in a silicon substrate, in some embodiments, or on a silicon substrate, in some embodiments. A doped silicon layer, which can be formed by in-situ doping epitaxially grown silicon, is disposed between the germanium layer and the silicon substrate. In embodiments where the germanium layer is on the silicon substrate, the doped silicon layer is disposed between the germanium layer and an oxide layer. The JFET has a doped polysilicon gate, and in some embodiments, a gate diffusion region is disposed in the germanium layer under the doped polysilicon gate. In some embodiments, a pinned photodiode passivation layer is disposed in the germanium layer. In some embodiments, a pair of doped regions in the germanium layer is configured as an e-lens of the germanium-based sensor. The disclosed germanium-based photosensitive devices can be implemented in indirect time-of-flight (iTOF) applications. For example, the exemplary germanium-based sensors can be a TOF sensor used in TOF applications. Details of embodiments of the present disclosure are described hereafter.

FIGS. 1A-1J are diagrammatic cross-sectional views of a photosensitive device 100, in portion or entirety, at various fabrication stages according to various aspects of the present disclosure. FIGS. 1A-1J have been simplified for the sake of clarity to better understand the inventive concepts of the present disclosure. Additional features can be added in photosensitive device 100, and some of the features described can be replaced, modified, or eliminated in other embodiments of photosensitive device 100.

Turning to FIG. 1A, fabrication begins with forming a silicon cavity in a silicon substrate in a device region of a photosensitive device. For example, photosensitive device 100 has a device region 102A and a device region 102B and fabricating can begins with receiving a silicon substrate (wafer) 105, forming a patterned oxide layer 110 over silicon substrate 105, and forming cavities 115 (also referred to as trenches or recesses) in silicon substrate 105 in device region 102A and device region 102B using patterned oxide layer 110 as an etch mask. In some embodiments, patterned oxide layer 110 is formed by depositing an oxide layer over silicon substrate 105, performing a lithography process to form a patterned resist layer over the oxide layer, and performing an etching process to transfer a pattern formed in the patterned resist layer to the oxide layer, thereby forming patterned oxide layer 110. Patterned oxide layer 110 has an oxide layer portion 110A, an oxide layer portion 110B, and an oxide layer portion 110C, where an opening 112A that exposes silicon substrate 105 is formed by oxide layer portion 110A and oxide layer portion 110B and an opening 112B that exposes silicon substrate 105 is formed by oxide layer portion 110B and oxide layer portion 110C. Patterned oxide layer 110 has a thickness t1. In some embodiments, thickness t1 is about 50 nm to about 90 nm. The lithography process can include forming a resist layer on the oxide layer (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove exposed portions of the oxide layer, thereby forming opening 112A and opening 112B that extend through the oxide layer and expose silicon substrate 105. The etching process can include a dry etching process, a wet etching process, other suitable etching process, or combinations thereof. After the etching process, the patterned resist layer can be removed, for example, by a resist stripping process. In some embodiments, the patterned resist layer is removed, completely or partially, during etching of the oxide layer and/or during etching of silicon substrate 105. In some embodiments, the exposure process can implement maskless lithography, electron-beam writing, and/or ion-beam writing.

An etching process is then performed using patterned oxide layer 110 as an etch mask to form cavities 115 in silicon substrate 105. For example, portions of silicon substrate 105 exposed by opening 112A and opening 112B of patterned oxide layer 110 are removed by the etching process, thereby forming cavities 115 having bottoms and sidewalls formed by silicon substrate 105. Cavities 115 have a depth D and a width W. In some embodiments, depth D is about 900 nm to about 1,500 nm. In some embodiments, width W is about 2,000 nm to about 10,000 nm. In some embodiments, the etching process is configured to selectively remove silicon substrate 105 with respect to patterned oxide layer 110. In other words, the etching process substantially removes silicon substrate 105 but does not remove, or does not substantially remove, patterned oxide layer 110. For example, an etchant is selected for the etch process that etches silicon (i.e., silicon substrate 105) at a higher rate than silicon oxide (i.e., patterned oxide layer 110) (i.e., the etchant has a high etch selectivity with respect to silicon). The etching process is a dry etching process, a wet etching process, other suitable etching process, or combinations thereof.

Figure 1B:
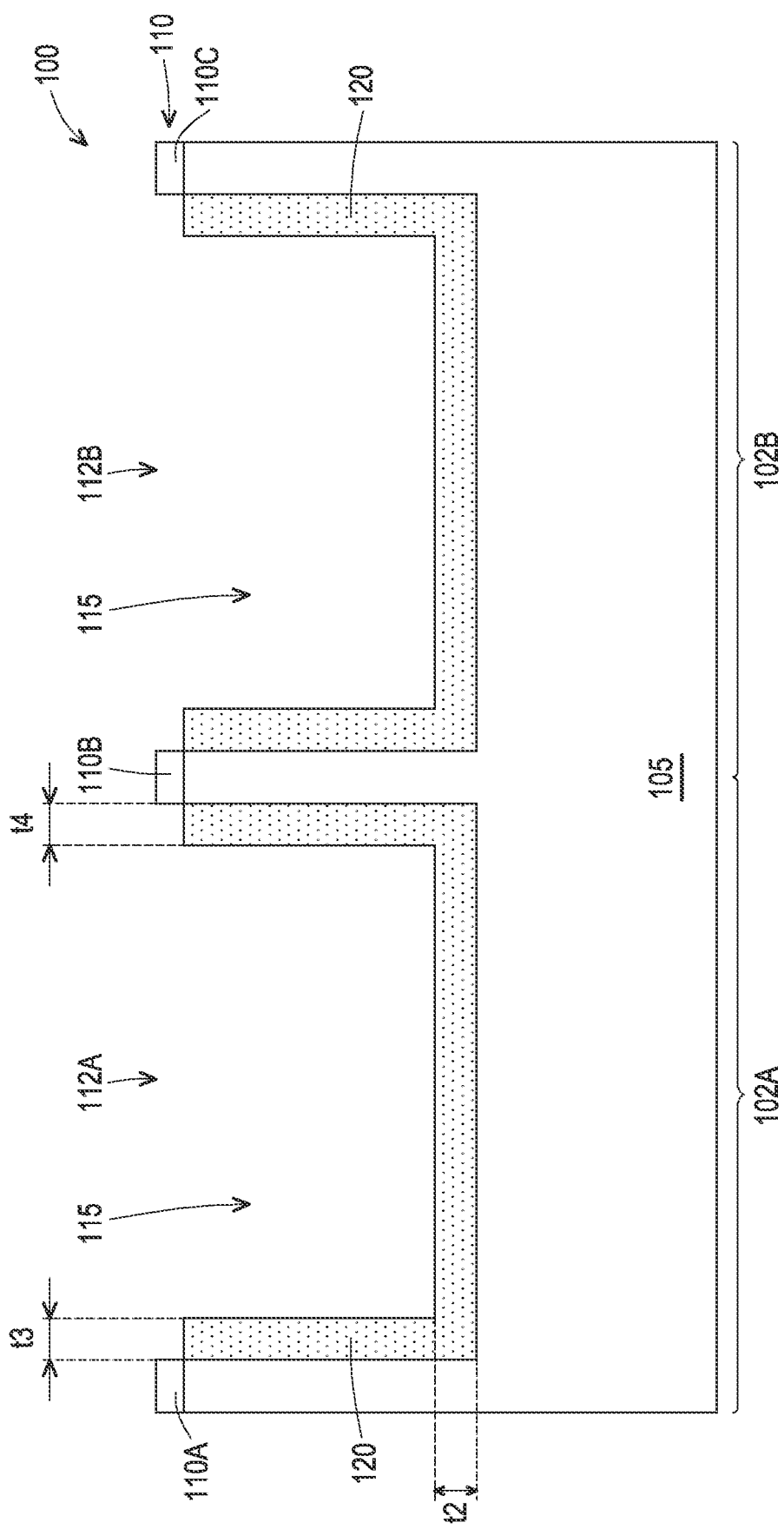

Turning to FIG. 1B, a doped silicon layer is formed in and partially fill the silicon cavities. For example, doped silicon layers 120 are formed in and partially fill cavities 115. Doped silicon layers 120 include n-type dopant (e.g., phosphorus, arsenic, other n-type dopant, or combinations thereof), p-type dopant (e.g., boron, indium, other p-type dopant, or combinations thereof), or combinations thereof. A dopant concentration of doped silicon layers 120 is greater than a dopant concentration of silicon substrate 105. In some embodiments, doped silicon layers 120 have a dopant concentration of about $5 \times 10^{16}$ atoms/cm$^3$ (cm$^{-3}$) to about $5 \times 10^{18}$ cm$^{-3}$. In some embodiments, silicon substrate 105 has a dopant concentration that is less than about $1 \times 10^{15}$ cm$^{-3}$. In some embodiments, doped silicon layers 120 include n-type dopant, such as phosphorous, and can be referred to as n-doped silicon layers (e.g., Si:P layers or Si:C:P layers). In some embodiments, doped silicon layers 120 include p-type dopant, such as boron, and can be referred to as p-doped silicon layers (e.g., Si:B layers). Doped silicon layers 120 are disposed along and covers bottoms and sidewalls of cavities 115. A thickness t2 of doped silicon layers 120 along bottoms of cavities 115 is less than depth D of cavities 115, and a total thickness of doped silicon layers 120 along sidewalls of cavities 115 (i.e., a sum of a thickness t3 along a first sidewall of a respective silicon cavity 115 and a thickness t4 along a second sidewall of a respective silicon cavity) is less than width W of cavities 115. In some embodiments, thickness t2, thickness t3, and thickness t4 are substantially the same, such that doped silicon layers 120 are conformal layers (i.e., a layer having a substantially uniform thickness over various surfaces). In some embodiments, thickness t2 is different than thickness t3 and/or thickness t4. In some embodiments, thickness t3 is substantially the same as thickness t4. In some embodiments, thickness t3 is different than thickness t4. In some embodiments, thickness t2, thickness t3, and/or thickness t4 is about 10 nm to about 100 nm. In the depicted embodiment, doped silicon layers 120 are substantially u-shaped. Doped silicon layers 120 can have different shapes depending on a profile of cavities 115.

In some embodiments, doped silicon layers 120 are formed by a deposition process that selectively grows silicon on silicon substrate 105 without growing silicon on patterned oxide layer 110. For example, doped silicon layers 120 are formed by epitaxially growing silicon from silicon substrate 105. An epitaxy process for forming doped silicon layers 120 can implement chemical vapor deposition (CVD) deposition techniques (for example, vapor-phase epitaxy (VPE), ultra-high vacuum CVD (UHV-CVD), low pressure CVD (LPCVD), and/or plasma enhanced CVD (PECVD)), molecular beam epitaxy, other suitable selective epitaxial growth (SEG) processes, or combinations thereof. The epitaxy process can use gaseous and/or liquid precursors, which include a silicon-containing precursor (for example, silane ($SiH_4$), disilane ($Si_2H_6$), trisilane ($Si_3H_8$), dichlorosilane (DCS) ($Si_2H_2Cl_2$), other suitable silicon-containing precursor, or combinations thereof) and a carrier precursor (for example, a hydrogen precursor (e.g., $H_2$), an argon precursor (e.g., Ar), a helium precursor (e.g., He), a nitrogen precursor (e.g., $N_2$), a xenon precursor, other suitable inert precursor, or combinations thereof). In the depicted embodiment, the epitaxy process further uses a dopant precursor, such as phosphine ($PH_3$), arsine ($AsH_3$), diborane ($B_2H_6$), other suitable dopant-containing precursor, or combinations thereof. Epitaxially grown silicon is thus doped during deposition (i.e., in-situ doped). In some embodiments, epitaxially grown silicon is doped after deposition, for example, by an ion implantation process and/or a diffusion process. In some embodiments, a cleaning process and/or a surface treatment process (collectively referred to as a cleaning process) is performed before forming doped silicon layers 120 to remove defects from silicon substrate 105 and/or patterned oxide layer 110, such as any native oxide, contaminates, and/or other defects on silicon substrate 105 and/or patterned oxide layer 110. In some embodiments, the cleaning process is a baking process performed in an etchant-comprising ambient, where defects are removed (etched) from silicon substrate 105 and/or patterned oxide layer 110 during the baking process. For example, a chlorine-based baking process, such as an HCl baking process, is performed that can remove (clean) surface nucleation sites on patterned oxide layer 110.

Figure 1C:
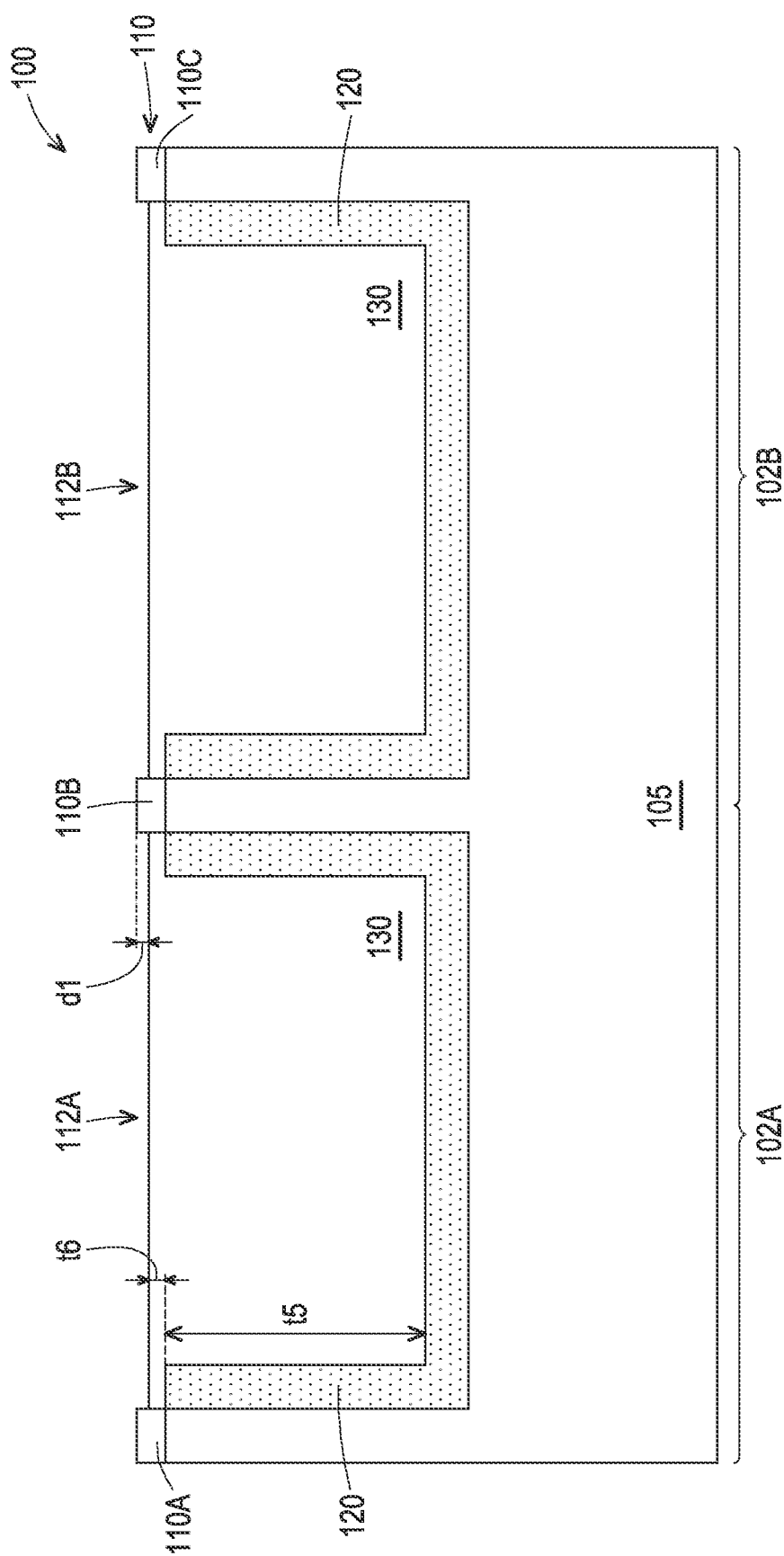

Turing to FIG. 1C, a germanium layer is formed in and fills a remainder of the silicon cavity. For example, germanium layers 130 are formed in and fill remainders of cavities 115. Germanium layers 130 each have a first portion wrapped by a respective doped silicon layer 120 and a second portion disposed above doped silicon layer 120 and between respective oxide layer portions of patterned oxide layer 110. For example, doped silicon layers 120 are disposed along bottoms and sidewalls of the first portions of germanium layers 130, while the second portions of germanium layers 130 cover top surfaces of sidewall portions of doped silicon layers 120 and contact oxide layer portion 110A, oxide layer portion 110B, and/or oxide layer portion 110C. The first portion has a thickness t5 that is less than depth D (e.g., thickness t5=depth D−thickness t2) and a width that is less than width W (e.g., first portion width=width W−(thickness t3+thickness t4)), and the second portion has a thickness t6 and a width that is about the same as width W. In some embodiments, thickness t5 is about 900 nm to about 1,500 nm. Thickness t6 is less than thickness t1 of patterned oxide layer 110, such that germanium layers 130 partially fill opening 112A and opening 112B of patterned oxide layer 110 and a distance d1 is between top surfaces of germanium layers 130 and a top surface of patterned oxide layer 110. In some embodiments, thickness t6 is about 0 nm to about 10 nm. In some embodiments, distance d1 is about 0 nm to about 10 nm. In the depicted embodiment, germanium layers 130 are pure germanium layers. In some embodiments, germanium layers 130 are undoped (or unintentionally doped (UID)) (i.e., germanium layers 130 are substantially free of dopant). In some embodiments, germanium layers 130 have a dopant concentration that is considered undoped. In some embodiments, germanium layers 130 are doped with n-type dopant (e.g., phosphorous), p-type dopant (e.g., boron), or combinations thereof.

In some embodiments, germanium layers 130 are formed by a deposition process that selectively grows germanium on doped silicon layers 120 without growing germanium on patterned oxide layer 110. For example, germanium layers 130 are formed by epitaxially growing germanium from doped silicon layers 120. An epitaxy process for forming germanium layers 130 can implement CVD deposition techniques (for example, VPE, UHV-CVD, LPCVD, and/or PECVD), molecular beam epitaxy, other suitable SEG processes, or combinations thereof. The epitaxy process can use gaseous and/or liquid precursors. For example, the epitaxy process uses a use a germanium-containing precursor (for example, germane ($GeH_4$), digermane ($Ge_2H_6$), germanium tetrachloride ($GeCl_4$), germanium dichloride ($GeCl_2$), other suitable germanium-containing precursor, or combinations thereof) and a carrier precursor (for example, a hydrogen precursor (e.g., $H_2$), an argon precursor (e.g., Ar), a helium precursor (e.g., He), a nitrogen precursor (e.g., $N_2$), a xenon precursor, other suitable inert precursor, or combinations thereof). The epitaxy process is performed until epitaxially grown germanium extends between respective oxide layer portions of patterned oxide layer 110 and covers top surfaces of sidewall portions of doped silicon layers 120. In some embodiments, the epitaxy process is performed until epitaxially grown germanium fills opening 112A and opening 112B and, in some embodiments, extends a distance above the top surface of patterned oxide layer 110. A planarization process, such as a chemical mechanical polishing (CMP), can be performed to remove portions of epitaxially grown germanium extending above and/or over the top surface of patterned oxide layer 110, where patterned oxide layer 110 can function as a planarization stop (i.e., the planarization process stops upon reaching patterned oxide layer 110). In some embodiments, the top surface of patterned oxide layer 110 and top surfaces of germanium layers 130 are substantially planar after the planarization process. An etch back process can be performed on germanium layers 130 to recess the top surfaces of germanium layers 130 distance d1 from the top surface of patterned oxide layer 110. In some embodiments, the planarization process recesses the epitaxially grown germanium relative to the top surface of patterned oxide layer 110, such that the top surfaces of germanium layers 130 are distance d1 below the top surface of patterned oxide layer 110 after the planarization process. In such embodiments, an additional etch back process may be unnecessary. In embodiments where germanium layers 130 are doped, the epitaxy process can use a dopant precursor, such as those described herein, to in-situ dope the epitaxially grown germanium. In some embodiments, the epitaxially grown germanium is doped after deposition, for example, by an ion implantation process and/or a diffusion process. In some embodiments, a cleaning process is performed before forming germanium layers 130 to remove defects from doped silicon layers 120 and/or patterned oxide layer 110, such as any native oxide, contaminates, and/or other defects on doped silicon layers 120 and/or patterned oxide layer 110. In some embodiments, the cleaning process is a baking process, such as described herein.

Figure 1D:
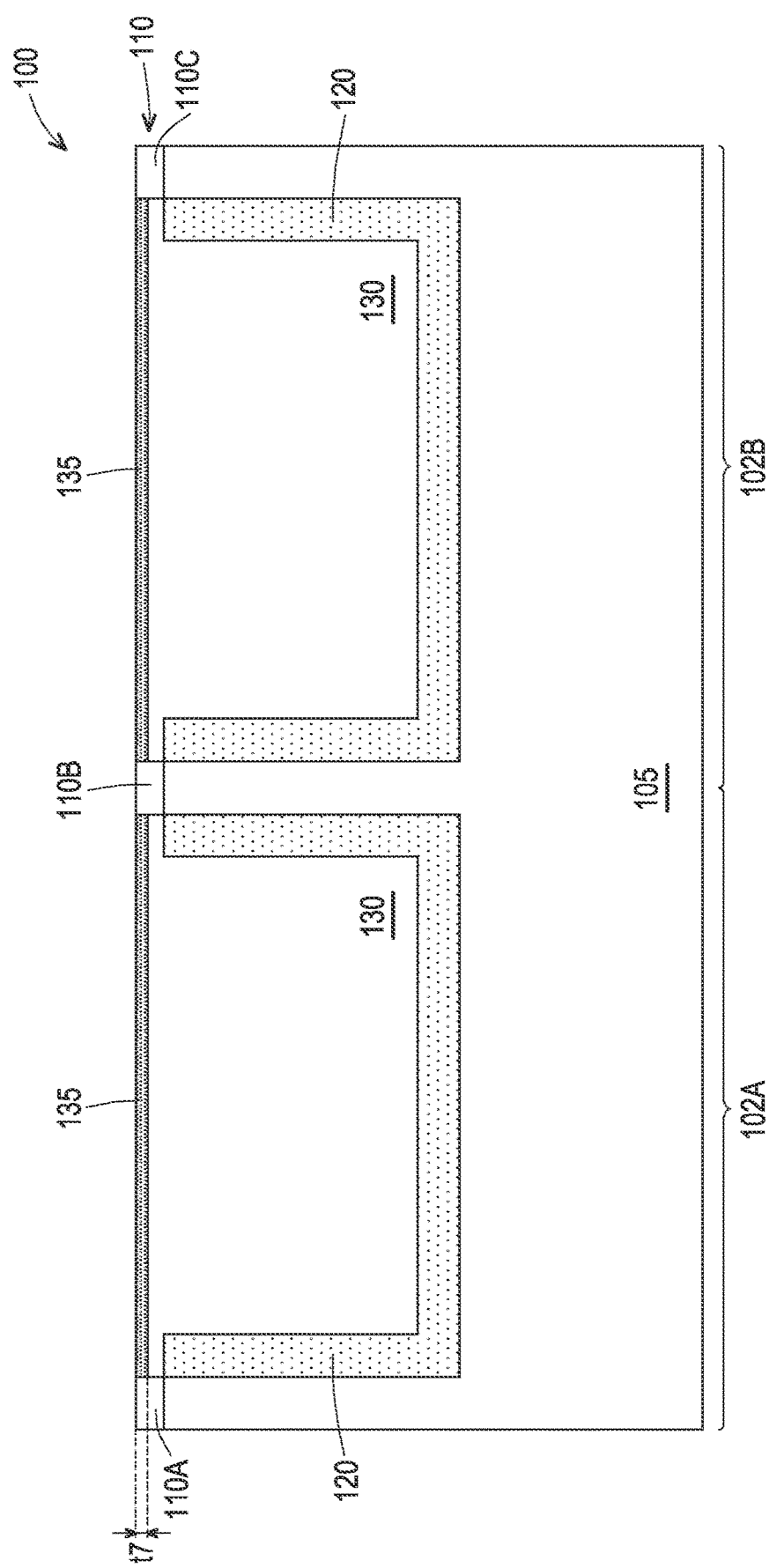

Turning to FIG. 1D, an undoped (or UID) cap layer is formed over the germanium layer. For example, cap layers 135 are formed over germanium layers 130. In the depicted embodiment, cap layers 135 are undoped silicon layers (i.e., silicon layers that are substantially free of dopant, such as n-type dopant (e.g., phosphorous) or p-type dopant (e.g., boron)). In some embodiments, cap layers 135 having a dopant concentration that is considered undoped. Cap layers 135 fill remainders of openings in patterned oxide layer 110, such as opening 112A and opening 112B. In the depicted embodiment, a first one of cap layers 135 is disposed between oxide layer portion 110A and oxide layer portion 110B, and a second one of cap layers 135 is disposed between oxide layer portion 110B and oxide layer portion 110C. Cap layers 135 have a thickness t7, which is less than thickness t1 of patterned oxide layer 110, and a width that is about the same as width W. In some embodiments, thickness t7 is about 10 nm to about 50 nm. In some embodiments, thickness t7 is substantially equal to distance d1. In some embodiments, cap layers 135 are formed by a deposition process that selectively grows silicon on germanium layers 130 without growing silicon on patterned oxide layer 110. For example, cap layers 135 are formed by epitaxially growing silicon from germanium layers 130. An epitaxy process for forming cap layers 135 can implement CVD deposition techniques (for example, VPE, UHV-CVD, LPCVD, and/or PECVD), molecular beam epitaxy, other suitable SEG processes, or combinations thereof. The epitaxy process can use gaseous and/or liquid precursors, such as a silicon-containing precursor and a carrier precursor, such as those described herein. The epitaxy process is performed until epitaxially grown silicon fills opening 112A and opening 112B of patterned oxide layer 110. In some embodiments, the epitaxially grown silicon may overfill opening 112A and opening 112B, such that the epitaxially grown silicon extends above the top surface of patterned oxide layer 110. In such embodiments, a planarization process, such as CMP, can be performed to remove portions of epitaxially grown silicon extending above and/or over the top surface of patterned oxide layer 110, where patterned oxide layer 110 can function as a planarization stop. In some embodiments, the top surface of patterned oxide layer 110 and top surfaces of cap layers 135 are substantially planar after the planarization process. In some embodiments, cap layers 135 are formed by depositing an undoped semiconductor layer over patterned oxide layer 110, doped silicon layers 120, and germanium layers 130, where the undoped semiconductor layer fills remainders of opening 112A and opening 112B, and then, performing a planarization process to remove the undoped semiconductor layer formed over the top surface of patterned oxide layer 110. In some embodiments, a cleaning process is performed before forming cap layers 135 to remove defects from germanium layers 130 and/or patterned oxide layer 110, such as any native oxide, contaminates, and/or other defects on germanium layers 130 and/or patterned oxide layer 110. In some embodiments, the cleaning process is a baking process, such as those described herein.

Figure 1E:
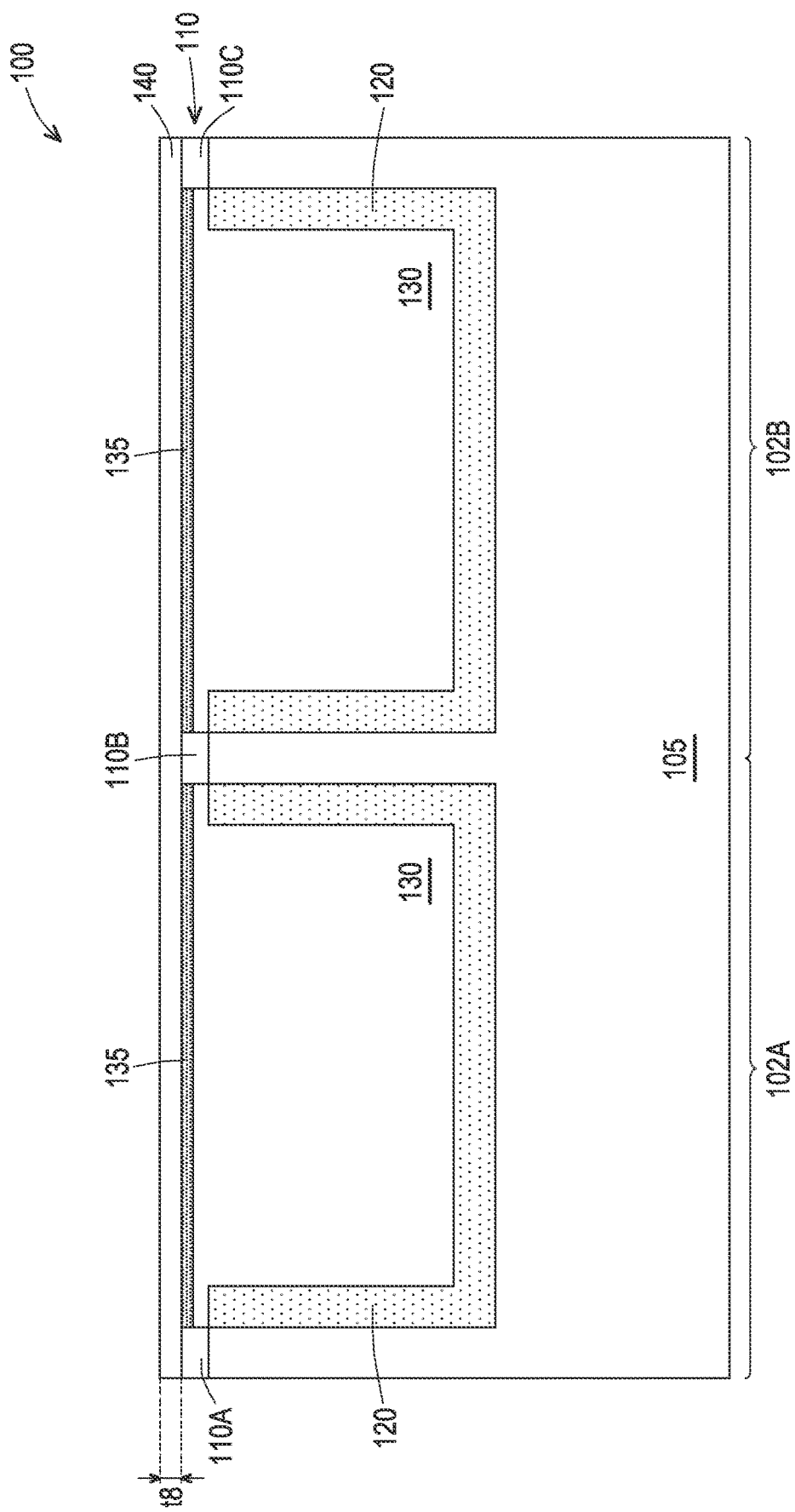

Turning to FIG. 1E, an oxide layer is formed over the photosensitive device. For example, an oxide layer 140 is formed over photosensitive device 100, such that oxide layer 140 covers device region 102A and device region 102B. In the depicted embodiment, oxide layer 140 covers patterned oxide layer 110 and cap layers 135. Oxide layer 140 includes oxygen and, in some embodiments, another suitable constituent. For example, oxide layer 140 can include silicon and oxygen (e.g., $SiO_2$) and be referred to as a silicon oxide layer. Oxide layer 140 has a thickness t8. In some embodiments, thickness t8 is about 10 nm to about 20 nm. Any suitable deposition process is implemented for forming oxide layer 140, such as CVD, physical vapor deposition (PVD), atomic layer deposition (ALD), high density plasma CVD (HDPCVD), metal organic CVD (MOCVD), remote plasma CVD (RPCVD), rapid thermal CVD (RTCVD), PECVD, plasma enhanced ALD (PEALD), LPCVD, atomic layer CVD (ALCVD), atmospheric pressure CVD (APCVD), other suitable methods, or combinations thereof. In the depicted embodiment, oxide layer 140 is formed over photosensitive device 100 by CVD.

Figure 1F:
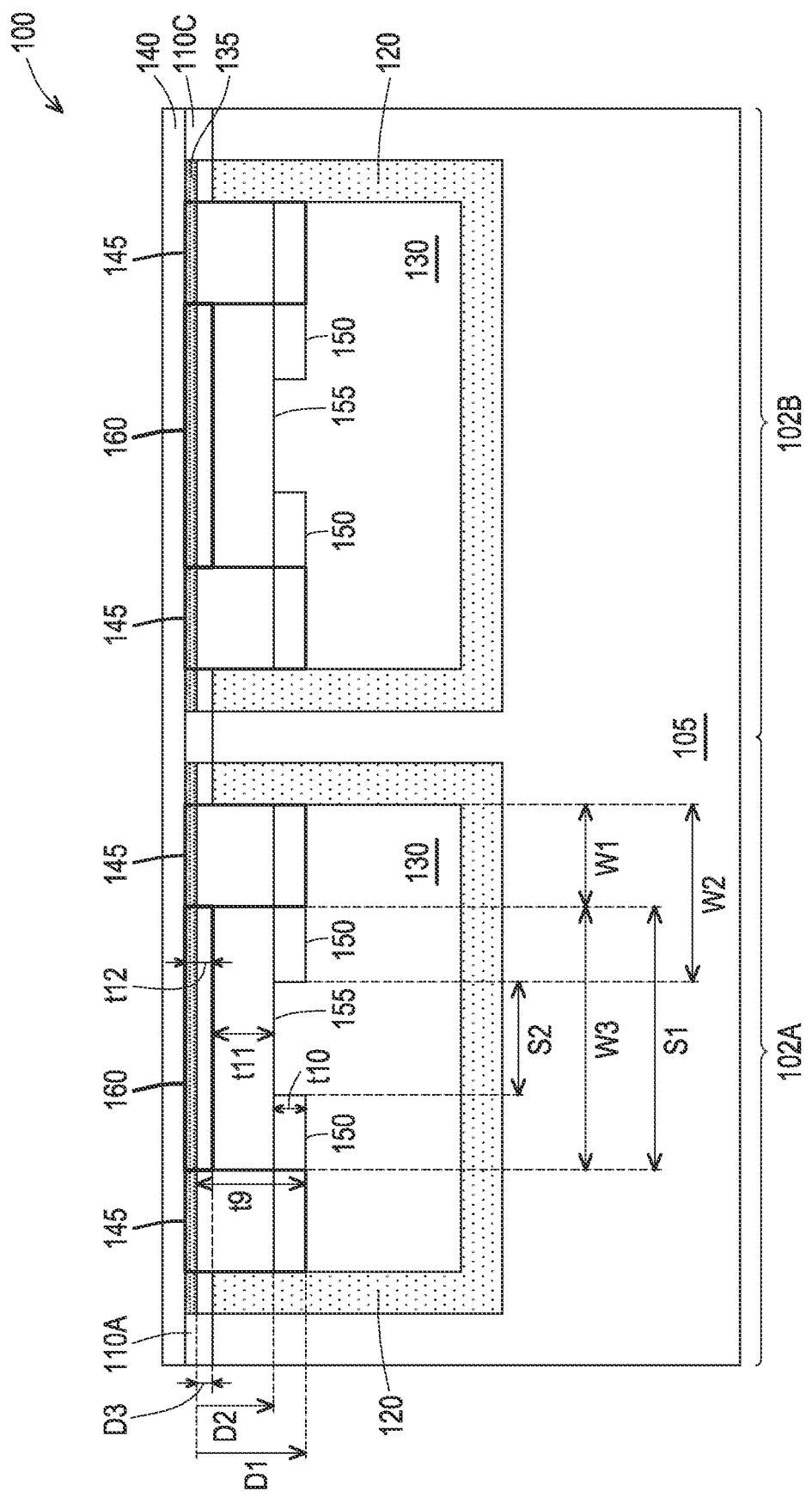

Turning to FIG. 1F, various doped regions are formed in the undoped cap layer and/or the germanium layer of the device region of the photosensitive device. For example, a pair of first type doped regions 145, a pair of first type doped regions 150, a second type doped region 155, and a first type doped region 160 are formed in a respective cap layer 135 and/or a respective germanium layer 130 of device region 102A and device region 102B. In the depicted embodiment, first type doped regions 145 and first type doped regions 160 are formed in cap layers 135 and germanium layers 130, while first type doped regions 150 and second type doped regions 155 are formed in germanium layers 130. First type doped regions 145, first type doped regions 150, and first type doped regions 160 include a first type dopant. Second type doped regions 155 include a second type dopant that is different than the first type dopant. Accordingly, first type doped regions 145 include first type doped silicon portions (i.e., portions of cap layers 135) and first type doped germanium portions (i.e., portions of germanium layers 130), first type doped regions 150 include first type doped germanium portions (i.e., portions of germanium layers 130), second type doped regions 155 include second type doped germanium portions (i.e., portions of germanium layers 130), and first type doped regions 160 include first type doped silicon portions (i.e., portions of cap layers 135) and first type doped germanium portions (i.e., portions of germanium layers 130). In some embodiments, the first type dopant is an n-type dopant (e.g., phosphorous), and the second type dopant is a p-type dopant (e.g., boron). In such embodiments, first type doped regions 145, first type doped regions 150, and first type doped regions 160 are n-doped regions, and second type doped regions 155 are p-doped regions. In furtherance of such embodiments, first type doped regions 145 can be referred to as germanium n-wells (GNWs) and first type doped regions 150 can be referred to as deep germanium n-wells (DGNWs). In some embodiments, the first type dopant is a p-type dopant, and the second type dopant is an n-type dopant. In such embodiments, first type doped regions 145, first type doped regions 150, and first type doped regions 160 are p-doped regions, and second type doped regions 155 are n-doped regions. In furtherance of such embodiments, first type doped regions 145 can be referred to as germanium p-wells (GPWs) and first type doped regions 150 can be referred to as deep germanium p-wells (DGPWs). A dopant concentration of first type doped regions 150 is greater than a dopant concentration of first type doped regions 145 and less than a dopant concentration of first type doped regions 160. A dopant concentration of second type doped regions 155 is less than first type doped regions 160, greater than a dopant concentration of first type doped regions 145, and greater than a dopant concentration of first type doped regions 150. A dopant concentration of first type doped regions 145 is less than a dopant concentration of first type doped regions 160. In some embodiments, first type doped regions 145 have a dopant concentration of about $1\times10^{14}$ $cm^{-3}$ to about $9\times10^{15}$ $cm^{-3}$. In some embodiments, first type doped regions 150 have a dopant concentration of about $1\times10^{17}$ $cm^{-3}$ to about $9\times10^{18}$ $cm^{-3}$. In some embodiments, second type doped regions 155 have a dopant concentration of about $1\times10^{17}$ $cm^{-3}$ to about $9\times10^{18}$ $cm^3$. In some embodiments, first type doped regions 160 have a dopant concentration of about $1\times10^{19}$ $cm^{-3}$ to about $9\times10^{20}$ $cm^3$.

First type doped regions 145 extend from top surfaces of cap layers 135 to a depth D1 in germanium layers 130. First type doped regions 150 are disposed in germanium layers 130 at a depth D2, extending from depth D2 to depth D1 (which is greater than D2) in germanium layer 130. Second type doped regions 155 are disposed in germanium layers 130 at a depth D3, extending from depth D3 to depth D2 (which is greater than depth D3) in germanium layer 130. First type doped regions 160 extend from top surfaces of cap layers 135 to depth D3 in germanium layers 130. Depth D1, depth D2, and depth D3 are measured from top surfaces of germanium layers 130. In some embodiments, depth D1 is about 100 nm to about 200 nm. In some embodiments, depth D2 is about 60 nm to about 90 nm. In some embodiments, depth D3 is about 10 nm to about 20 nm. First type doped regions 160 are disposed over second type doped regions 155, where p-n junctions are formed by interfaces between first type doped regions 160 and second type doped region 155. Second type doped regions 155 are further disposed between first type doped regions 145, where p-n junctions are formed by interfaces between second type doped regions 155 and first type doped regions 145. First type doped regions 160 are also disposed between first type doped regions 145, where interfaces are between first type doped regions 160 and first type doped regions 145. First type doped regions 150 extend under second type doped regions 155, where p-n junctions are formed by interfaces between first type doped regions 150 and second type doped regions 155. First type doped regions 145 are disposed along doped silicon layers 120 and overlap an entire width of first type doped regions 150. In some embodiments, first type doped regions 145 extend a depth into germanium layers 130 that is less than depth D1, such that first type doped regions 145 partially overlap first type doped regions 150 along their width. First type doped regions 145 have a thickness t9 and a width W1, first type doped regions 150 have a thickness t10 and a width W2, second type doped regions 155 have a thickness t11 and a width W3, and first type doped regions 160 have a thickness t12 and width W3. First type doped regions 145 disposed in a respective germanium layer 130 are separated by a spacing Si (which, in the depicted embodiment, is substantially equal to width W3) and first type doped regions 150 disposed in the respective germanium layer 130 are separated by a spacing S2 (which, in the depicted embodiment, is less than width W3). In some embodiments, thickness t9 is about 85 nm to about 200 nm. In some embodiments, thickness t10 is about 20 nm to about 30 nm. In some embodiments, thickness t11 is about 60 nm to about 150 nm. In some embodiments, thickness t12 is about 5 nm to about 20 nm. In some embodiments, width W1 is about 400 nm to about 1,500 nm. In some embodiments, width W2 is about 800 nm to about 2,500 nm. In some embodiments, width W3 is about 3,000 nm to about 5,000 nm. In some embodiments, thickness t9 is a sum of thickness t7 and depth D1, thickness t10 is a difference of depth D1 and depth D2, thickness t11 is a difference of depth D2 and depth D3, and/or thickness t12 is a sum of thickness t7 and depth D3.

The various doped regions can be formed in cap layers 135 and/or germanium layers 130 by lithography processes, such as those described herein, and implantation processes. For example, forming the various doped regions can include performing a first lithography process to form a first implant mask that exposes first areas of germanium layers 130 and performing a first implantation process using the first implant mask to introduce first type dopant into the first areas of germanium layers 130 to form first type doped regions 145; performing a second lithography process to form a second implant mask that exposes second areas of germanium layers 130 (which can partially overlap the first areas) and performing a second implantation process using the second implant mask to introduce first type dopant into the second areas of germanium layers 130 to form first type doped regions 150; performing a third lithography process to form a third implant mask that exposes a third area of germanium layers 130 (which can partially overlap the second areas and span between the first areas) and performing a third implantation process using the third implant mask to introduce second type dopant into the third area of germanium layers 130 to form second type doped regions 155; and performing a fourth lithography process to form a fourth implant mask that exposes a fourth area of germanium layers 130 (which can overlap an entirety of the third area) and performing a fourth implantation process using the fourth implant mask to introduce first type dopant into the fourth area of germanium layers 130 to form first type doped regions 160. In some embodiments, second type doped regions 155 and first type doped regions 160 are formed using one lithography process, instead of two. For example, the fourth lithography process can be omitted, and both the third implantation process and the fourth implantation process can use the third implant mask to form second type doped regions 155 and first type doped regions, respectively. In such embodiments, parameters of the implantation processes, such as implant energy, implant dopant type, implant dosage, implant angle, and/or other suitable implant parameter, can be tuned to provide second type doped regions 155 and first type doped regions 160 in germanium layers 130. The present disclosure contemplates the first, second, third, and fourth lithography/implantation processes being performed in any order. In some embodiments, parameters of the first, second, third, and/or fourth implantation processes, such as implant energy, implant dopant type, implant dosage, implant angle, and/or other suitable implant parameter, are tuned to achieve desired depths, desired dopant concentrations, desired dimensions (e.g., thicknesses and/or widths), and/or configurations of first type doped regions 145, first type doped regions 150, second type doped regions 155, and/or first type doped regions 160.

Figure 1G:
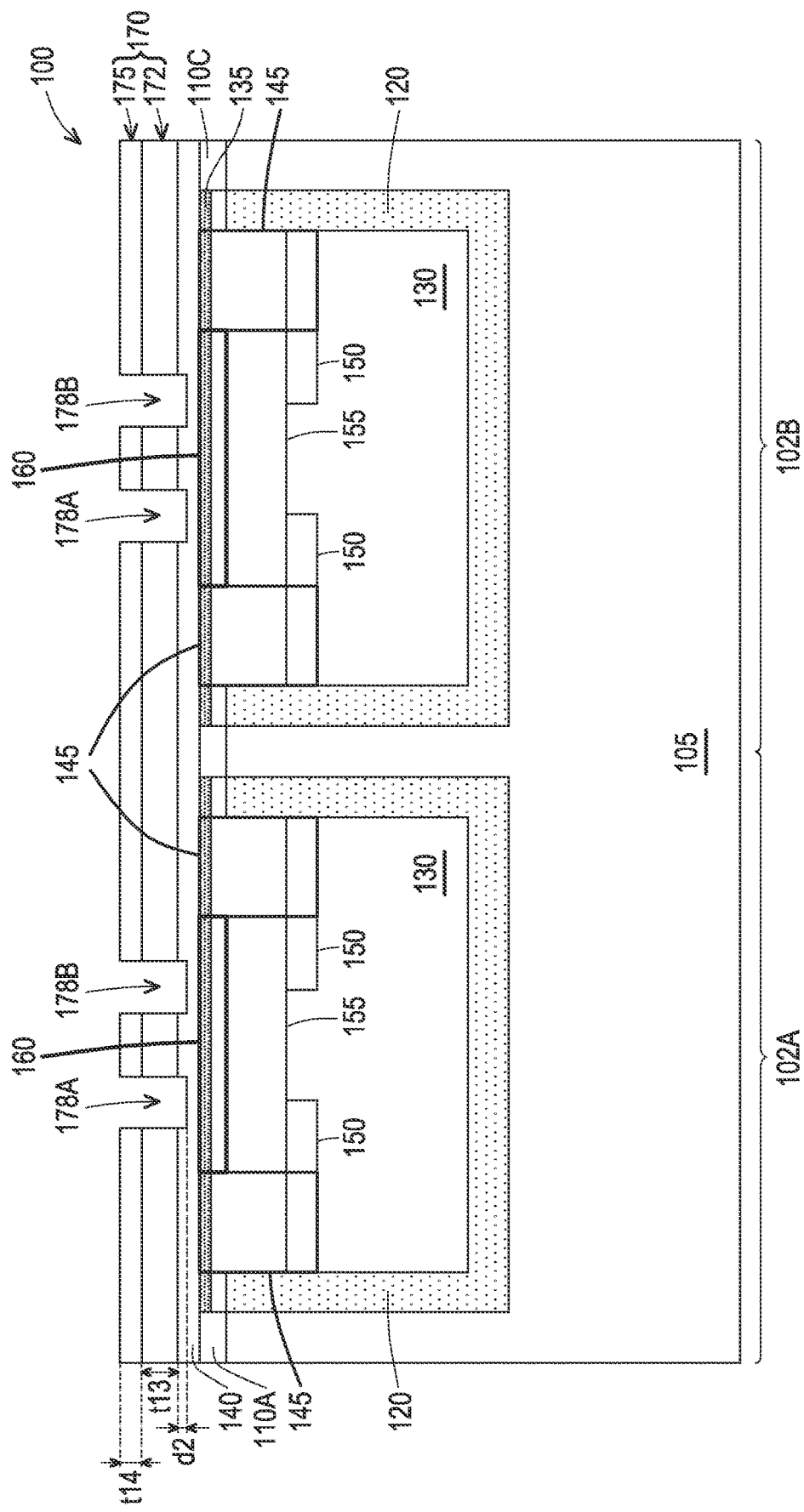

Turing to FIGS. 1G-1J, doped polysilicon gates are formed over the germanium layer and first type doped regions are formed in the germanium layer under the doped polysilicon gates by self-diffusion. In FIG. 1G, fabrication can include forming a patterned mask layer 170 over oxide layer 140, where the patterned mask layer 170 has a gate opening 178A and a gate opening 178B in device region 102A and device region 102B that expose oxide layer 140. Gate openings 178A and gate openings 178B are located over second type doped regions 155 and first type doped regions 160 formed in germanium layers 130. In the depicted embodiment, patterned mask layer 170 has a patterned dielectric layer 172 and a patterned oxide layer 175 disposed over patterned dielectric layer 172. Patterned dielectric layer 172 includes a dielectric material that is suitable for subsequently-formed gate spacers, such as a dielectric material that includes silicon, oxygen, carbon, nitrogen, other suitable constituent, or combinations thereof (e.g., silicon oxide, silicon nitride, silicon oxynitride, silicon carbide, silicon carbon nitride, silicon oxycarbide, and/or silicon oxycarbonitride). Patterned oxide layer 175 includes a dielectric material that includes oxygen, and in some embodiments, another suitable constituent. In the depicted embodiment, patterned dielectric layer 172 includes silicon and nitrogen and can be referred to as a silicon nitride layer and patterned oxide layer 175 includes silicon and oxygen and can be referred to as a silicon oxide layer. Patterned dielectric layer 172 has a thickness t13, which corresponds with a thickness of subsequently-formed gate spacers, and patterned oxide layer 175 has a thickness t14. In some embodiments, thickness t13 is about 30 nm to about 50 nm. In some embodiments, thickness t14 is about 20 nm to about 40 nm.

In some embodiments, patterned mask layer 170 is formed by depositing a dielectric layer over oxide layer 140, depositing an oxide layer over the dielectric layer, performing a lithography process to form a patterned resist layer over the oxide layer, and performing an etching process to transfer a resist pattern formed in the patterned resist layer to the oxide layer and the dielectric layer, thereby forming patterned mask layer 170 having patterned dielectric layer 172 and patterned oxide layer 175. The dielectric layer and the oxide layer are deposited by CVD, PVD, ALD, HDPCVD, MOCVD, RPCVD, RTCVD, PECVD, PEALD, LPCVD, ALCVD, APCVD, other suitable methods, or combinations thereof. The lithography process can include forming a resist layer on the oxide layer (for example, by spin coating), performing a pre-exposure baking process, performing an exposure process using a mask, performing a post-exposure baking process, and performing a developing process, such as described herein. The etching process uses the patterned resist layer as an etch mask to remove exposed portions of the oxide layer and the dielectric layer to form gate openings 178A and gate openings 178B therein, which correspond with locations for subsequently-formed gates of photosensitive device 100. The etching process includes a dry etching process, a wet etching process, other suitable etching process, or combinations thereof. In some embodiments, portions of the oxide layer are removed to form patterned oxide layer 175 using the patterned resist layer as an etch mask and portions of the dielectric layer are removed to form patterned dielectric layer 172 using the patterned resist layer and/or patterned oxide layer 175 as an etch mask. In some embodiments, the etching process includes multiple steps, such as a first etch step that selectively etches the oxide layer and a second etch step that selectively etches the dielectric layer (e.g., the first etch step and the second etch step implement different etchants). In some embodiments, the oxide layer and the dielectric layer are removed using the same etchant. In some embodiments, the etching process stops upon reaching oxide layer 140. In the depicted embodiment, the etching process, intentionally or unintentionally, etches and recesses exposed portions of oxide layer 140 a distance d2, which provides oxide layer 140 with a varying thickness. For example, unexposed portions of oxide layer 140 have thickness t1, and exposed portions of oxide layer 140 have a thickness that is less than thickness t1 (for example, thickness of exposed portions of oxide layer 140=thickness t1−distance d2). In some embodiments, distance d2 is about 0 nm to about 5 nm. After the etching process, the patterned resist layer can be removed, for example, by a resist stripping process. In some embodiments, the patterned resist layer is removed, completely or partially, during etching of the oxide layer and/or the dielectric layer.

Figure 1H:
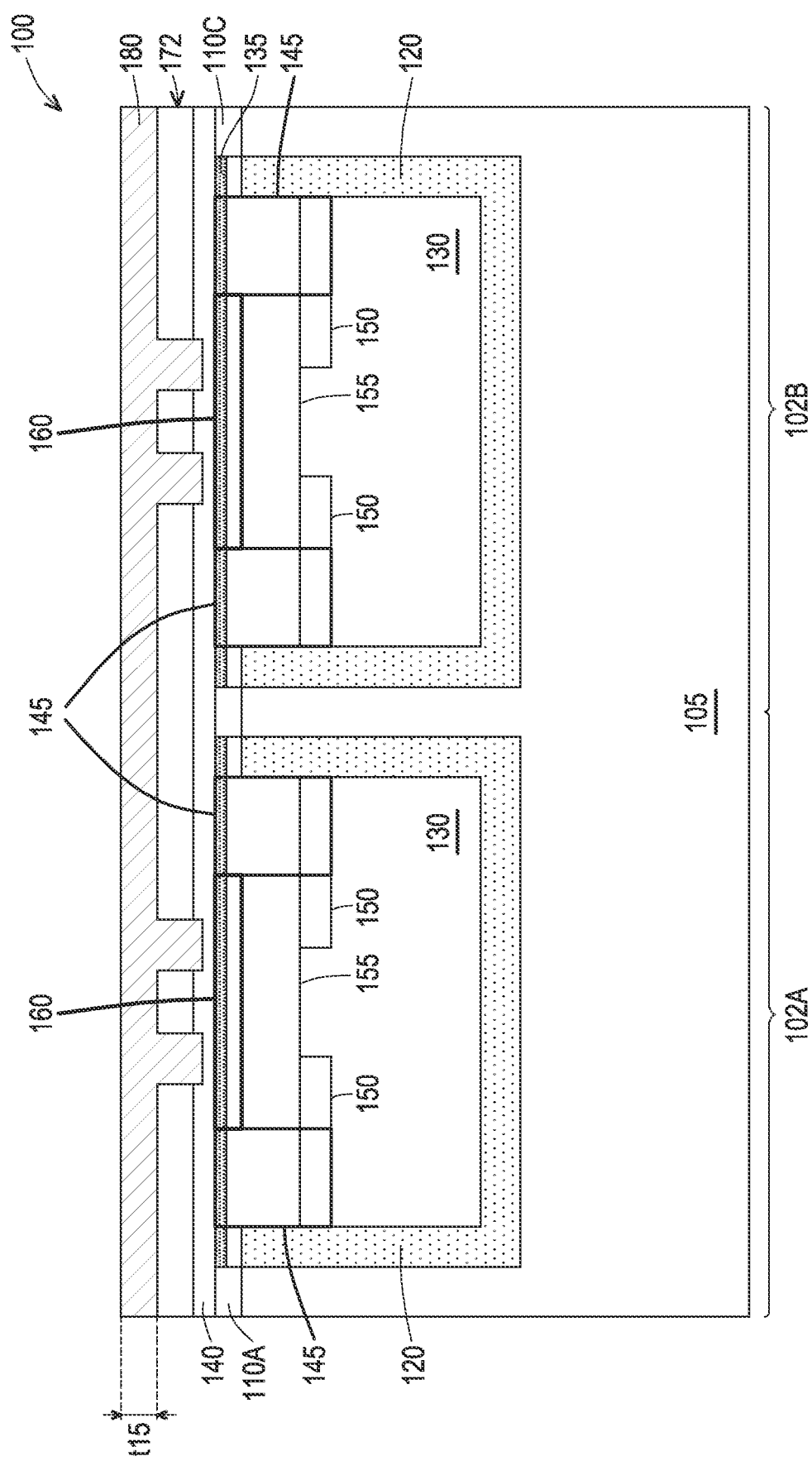
Figure 11:
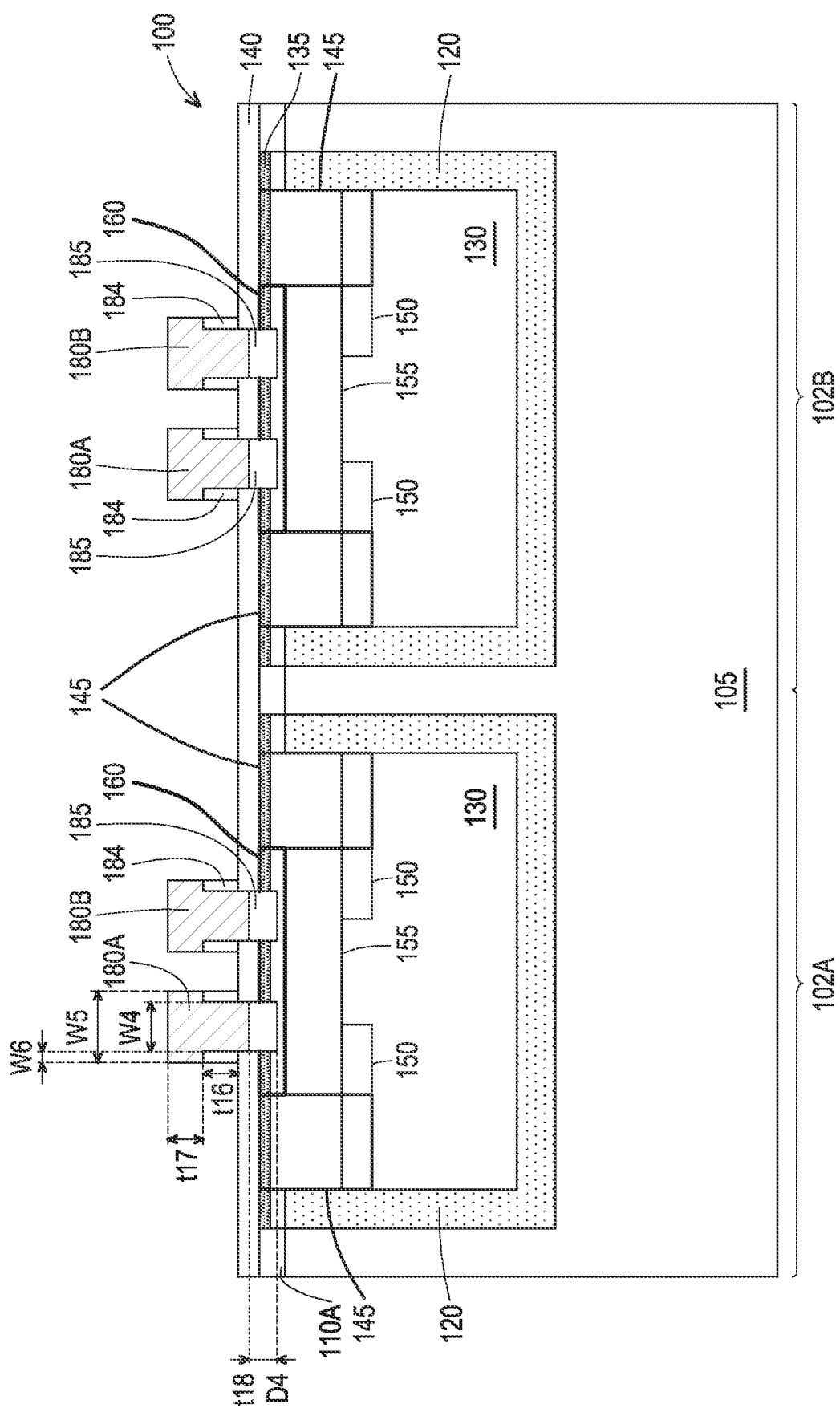

In FIG. 1H, fabrication can proceed with removing patterned oxide layer 175 from photosensitive device 100 and forming a doped polysilicon layer 180 over patterned dielectric layer 172, where doped polysilicon layer 180 fills gate openings 178A and gate openings 178B. In some embodiments, patterned oxide layer 175 is removed by an etching process, such as a dry etching process, a wet etching process, other suitable etching process, or combinations thereof. The etching process is configured to selectively remove patterned oxide layer 175 with respect to patterned dielectric layer 172. In other words, the etching process substantially removes patterned oxide layer 175 but does not remove, or does not substantially remove, patterned dielectric layer 172. For example, an etchant is selected for the etch process that etches silicon oxide (i.e., patterned oxide layer 175) at a higher rate than silicon nitride (i.e., patterned dielectric layer 172) (i.e., the etchant has a high etch selectivity with respect to silicon oxide). In the depicted embodiment, a selective wet etching process removes patterned oxide layer 175 using a diluted hydrofluoric acid (DHF) solution. In some embodiments, a selective wet etching process removes patterned oxide layer 175 using a buffered oxide etch (BOE) solution.

Doped polysilicon layer 180 is formed by depositing a polysilicon material over patterned dielectric layer 172 by CVD, PVD, ALD, HDPCVD, MOCVD, RPCVD, RTCVD, PECVD, PEALD, LPCVD, ALCVD, APCVD, other suitable methods, or combinations thereof. In the depicted embodiment, dopant is introduced into the polysilicon material during the depositing (i.e., in-situ). In some embodiments, dopant is introduced into the polysilicon material after the depositing (e.g., by an implantation process). In some embodiments, doped polysilicon layer 180 includes n-type dopant, such as phosphorous, and can be referred to as an n-doped polysilicon layer. In some embodiments, doped polysilicon layer 180 includes p-type dopant, such as boron, and can be referred to as a p-doped polysilicon layer. In some embodiments, doped polysilicon layer 180 has a dopant concentration of about $1\times10^{19}$ cm$^{-3}$ to about $1\times10^{21}$ cm$^{-3}$. Doped polysilicon layer 180 covers a top surface of patterned dielectric layer 172, fills gate openings 178A and gate openings 178B, and physically contacts oxide layer 140. A portion of doped polysilicon layer 180 over the top surface of patterned dielectric layer 172 has a thickness t15. In some embodiments, thickness t15 is about 80 nm to about 120 nm. Portions of doped polysilicon layer 180 that fill gate openings 178A, 178B have a thickness that is less than a sum of thickness t13 of patterned dielectric layer 172 and thickness t1 of oxide layer 140 (e.g., thickness=thickness t13+distance d2).

In FIG. 1I, fabrication can proceed with performing a patterning process on doped polysilicon layer 180 and patterned dielectric layer 172, thereby forming polysilicon gates 180A and polysilicon gates 180B from doped polysilicon layer 180 and gate spacers 184 from patterned dielectric layer 172. Polysilicon gates 180A and polysilicon gates 180B have first portions disposed between respective gate spacers 184 and second portions disposed over and covering top surfaces of respective gate spacers 184. The first portions have a thickness t16 and a width W4, and the second portions have a thickness t17 and a width W5 that is greater than width W4. In some embodiments, width W4 is about 200 nm to about 600 nm. In some embodiments, width W5 is about 30 nm to about 50 nm. In some embodiments, thickness t16 is about equal to thickness t13 of patterned dielectric layer 172. In some embodiments, thickness t17 is about equal to thickness t15. In some embodiments, thickness t17 is less than thickness t15. Gate spacers 184 are disposed along sidewalls of the first portions of polysilicon gates 180A and sidewalls of the first portions of polysilicon gates 180B. Gate spacers 184 have a height that is about equal to thickness t16 and a width W6, which is about equal to a difference of width W5 and width W4 (e.g. width W6=width W5−width W4).

In some embodiments, the patterning process includes performing a lithography process to form a patterned resist layer over doped polysilicon layer 180 and performing an etching process to transfer a resist pattern formed in the patterned resist layer to doped polysilicon layer 180, thereby forming polysilicon gates 180A and polysilicon gates 180B. The lithography process can include forming a resist layer on doped polysilicon layer 180 (for example, by spin coating), performing a pre-exposure baking process, performing an exposure process using a mask, performing a post-exposure baking process, and performing a developing process, such as described herein. The etching process uses the patterned resist layer as an etch mask to remove exposed portions of doped polysilicon layer 180, such that unexposed, covered portions of doped polysilicon layer 180 remain to provide polysilicon gates 180A and polysilicon gates 180B over oxide layer 140. The etching process includes a dry etching process, a wet etching process, other suitable etching process, or combinations thereof. In some embodiments, portions of doped polysilicon layer 180 are removed to form polysilicon gates 180A and polysilicon gates 180B using the patterned resist layer as an etch mask and portions of patterned dielectric layer 172 are removed to form gate spacers 184 using the patterned resist layer and/or polysilicon gates 180A and polysilicon gates 180B as an etch mask. In embodiments where polysilicon gates 180A and polysilicon gates 180B are used as etch masks for etching patterned dielectric layer 172, the etching process may, intentionally or unintentionally, etch second portions of polysilicon gates 180A and polysilicon gates 180B, such that thickness t17 is less than thickness t15. In some embodiments, the etching process includes multiple steps, such as a first etch step that selectively etches doped polysilicon layer 180 and a second etch step that selectively etches patterned dielectric layer 172 (e.g., the first etch step and the second etch step implement different etchants). The etching process is configured to selectively remove doped polysilicon layer 180 and/or patterned dielectric layer 172 with respect to oxide layer 140. In other words, the etching process substantially removes doped polysilicon layer 180 and/or patterned dielectric layer 172 but does not remove, or does not substantially remove, oxide layer 140. For example, an etchant is selected for the etch process that etches doped polysilicon (i.e., doped polysilicon layer 180) and/or silicon nitride (i.e., patterned dielectric layer 172) at a higher rate than silicon oxide (i.e., oxide layer 140) (i.e., the etchant has a high etch selectivity with respect to doped polysilicon and/or silicon nitride). In some embodiments, a mask layer is formed over doped polysilicon layer 180 and the patterned resist layer is formed over the mask layer. In such embodiments, a first etching process may remove portions of the mask layer to form a patterned mask layer, and a second etching process removes portions of doped polysilicon layer 180 and/or patterned dielectric layer 172 using the patterned mask layer as an etch mask. After the etching process, the patterned resist layer can be removed, for example, by a resist stripping process. In some embodiments, the patterned resist layer is removed, completely or partially, during etching of doped polysilicon layer 180 and/or patterned dielectric layer 172.

After forming polysilicon gates 180A and polysilicon gates 180B, fabrication can include performing a diffusion process to diffuse dopant form polysilicon gates 180A and polysilicon gates 180B into germanium layers 130, thereby forming first type doped regions 185 that connect polysilicon gates 180A and polysilicon gates 180B to first type doped regions 160 in germanium layers 130. First type doped regions 185 extend from polysilicon gates 180A and polysilicon gates 180B to a depth D4 in germanium layers 130, such that first type doped regions 185 overlap first type doped regions 160. Depth D4 is measured from top surfaces of germanium layers 130, and in the depicted embodiment, is less than depth D3. First type doped regions 185 thus include first type doped silicon portions (i.e., portions of cap layers 135) and first type doped germanium portions (i.e., portions of germanium layers 130). In some embodiments, depth D4 is about 5 nm to about 10 nm. First type doped regions 185 have a dopant concentration that is greater than a dopant concentration of first type doped regions 160. In some embodiments, first type doped regions 185 have a dopant concentration of about $1\times10^{19}$ cm$^{-3}$ to about $9\times10^{20}$ cm$^{-3}$. In some embodiments, first type doped regions 185 include n-type dopant, such as phosphorous, and can be referred to as n-doped germanium regions (Ge N+). In some embodiments, first type doped regions 185 include p-type dopant, such as boron, and can be referred to as p-doped germanium regions (Ge P+). In the depicted embodiment, first type doped regions 185 have a width that is about equal to width W4. In some embodiments, first type doped regions 185 have a width that is greater than or less than width W4. First type doped regions 185 have a thickness t18. In some embodiments, thickness t18 is about 30 nm to about 60 nm. In some embodiments, the diffusion process is an anneal process that drives dopant from polysilicon gates 180A and polysilicon gates 180B into germanium layers 130 to form first type doped regions 185. In some embodiments, the anneal process exposes polysilicon gates 180A and polysilicon gates 180B to heat having a temperature of about 700° C. to about 850° C. In some embodiments, the anneal process is performed for about 30 minutes to about 120 minutes. Forming first type doped regions 185 by self-diffusion prevents damage to photosensitive device 100 that can arise when first type doped regions 185 are formed by an implantation process, such as damage to doped regions (i.e., first type doped regions 145, first type doped regions 150, second type doped regions 155, and/or first type doped regions 160) in germanium layers 130 and/or damage to p-n junctions in germanium layers formed by interfaces between the doped regions. Since first type doped regions 185 are formed by self-diffusion of gates, first type doped regions 185 can alternatively be referred to as gate diffusion regions and/or diffusion regions.

Figure 1J:
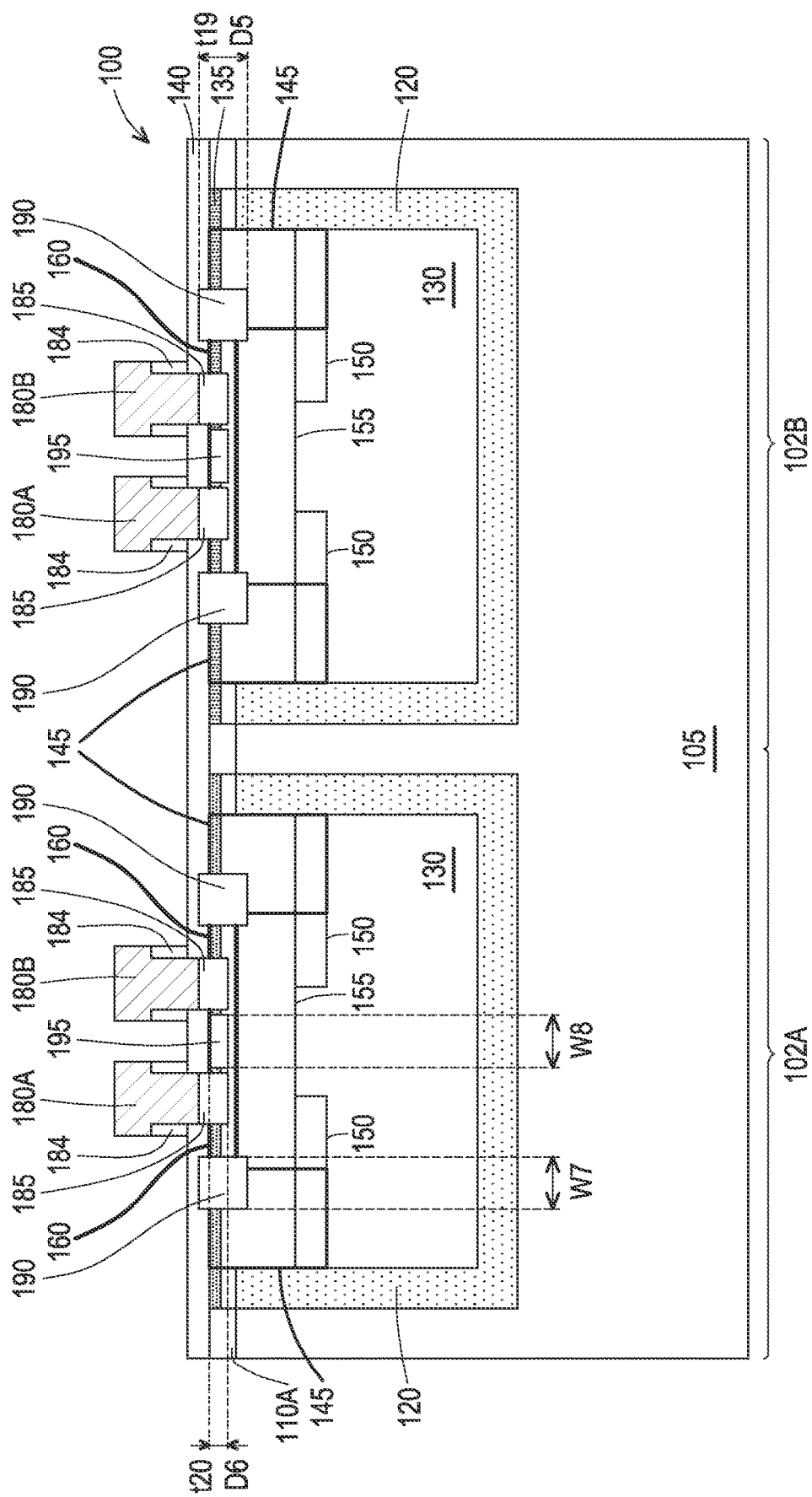

Turing to FIG. 1J, additional doped regions are formed in the germanium layer. For example, second type doped regions 190 are formed in germanium layers 130. Second type doped regions 190 extend a depth D5 in germanium layers 130, such that second type doped regions 190 overlap first type doped regions 145, second type doped regions 155, and first type doped regions 160. Second type doped regions 190 overlap interfaces between first type doped regions 145 and first type doped regions 160 and interfaces between first type doped regions 145 and second type doped regions 155 (which interfaces form p-n junctions). Second type doped regions 190 are spaced a distance from first type doped regions 185. Depth D5 is measured from top surfaces of germanium layers 130, and in the depicted embodiment, is greater than depth D3 and less than depth D2. Second type doped regions 190 thus include second type doped silicon portions (i.e., portions of cap layers 135) and second type doped germanium portions (i.e., portions of germanium layers 130). In some embodiments, depth D5 is about 20 nm to about 40 nm. In some embodiments, such as depicted, second type doped regions 190 extend into oxide layer 140 and have second type doped oxide portions. Second type doped regions 190 further have a width W7 and a thickness t19. In some embodiments, width W7 is about 30 nm to about 50 nm. In some embodiments, thickness t19 is about 300 nm to about 1,500 nm. Second type doped regions 190 have a dopant concentration that is greater than a dopant concentration of first type doped regions 145, second type doped regions 155, and/or first type doped regions 160. In some embodiments, second type doped regions 190 have a dopant concentration of about $1 \times 10^{17}$ $cm^{-3}$ to about $9 \times 10^{18}$ $cm^{-3}$. In some embodiments, second type doped regions 190 include p-type dopant, such as boron, and can be referred to as p-doped germanium regions (Ge P+). In some embodiments, second type doped regions 190 include n-type dopant, such as phosphorous, and can be referred to as n-doped germanium regions (Ge N+).

First type doped regions 195 are also formed in germanium layers 130. First type doped regions 195 extend a depth D6 in germanium layers 130, such that first type doped regions 195 overlap first type doped regions 160. First type doped regions 195 are located between respective first type doped regions 185 and spaced a distance from the respective first type doped regions 185. In some embodiments, the distance is about equal to width W6 of gate spacers 184. Depth D6 is measured from top surfaces of germanium layers 130, and in the depicted embodiment, is less than depth D3. First type doped regions 195 thus include first type doped silicon portions (i.e., portions of cap layers 135) and first type doped germanium portions (i.e., portions of germanium layers 130). In some embodiments, depth D6 is about 5 nm to about 10 nm. First type doped regions 195 further have a width W8 and a thickness t20. In some embodiments, width W8 is about equal to a spacing between polysilicon gates 180A and polysilicon gates 180B. In some embodiments, width W8 is about 2,000 nm to about 5,000 nm. In some embodiments, thickness t20 is about 10 nm to about 20 nm. First type doped regions 195 have a dopant concentration that is greater than a dopant concentration of first type doped regions 160. In some embodiments, first type doped regions 195 have a dopant concentration of about $1 \times 10^{18}$ $cm^{-3}$ to about $1 \times 10^{20}$ $cm^{-3}$. In some embodiments, first type doped regions 195 include n-type dopant, such as phosphorous, and can be referred to as n-doped germanium regions. In some embodiments, first type doped regions 195 include p-type dopant, such as boron, and can be referred to as p-doped germanium regions.

In some embodiments, second type doped regions 190 are formed by performing a lithography process to form an implant mask that exposes areas of germanium layers 130 that overlap interfaces between first type doped regions 145 and first type doped regions 160 and/or interfaces between first type doped regions 145 and second type doped regions 155 and performing an implantation process using the implant mask to introduce second type dopant into the exposed areas of germanium layers 130. In some embodiments, first type doped regions 195 are formed by performing a lithography process to form an implant mask that exposes areas of germanium layers 130 between polysilicon gates 180A and polysilicon gates 180B and performing an implantation process using the implant mask to introduce first type dopant into the exposed areas of germanium layers 130. In some embodiments, first type doped regions 195 are formed after second type doped regions 190. In some embodiments, first type doped regions 195 are formed before second type doped regions 190. In some embodiments, an anneal process is performed after forming first type doped regions 195 and/or second type doped regions 190, for example, to activate dopant therein and/or in other doped regions of photosensitive device 100, such as first type doped regions 145, first type doped regions 150, second type doped regions 155, first type doped regions 160, and/or first type doped regions 185. In some embodiments, the anneal process is a rapid thermal anneal (RTA). In some embodiments, the anneal process exposes photosensitive device 100 to heat having a temperature of about 700° C. to about 900° C. In some embodiments, the anneal process is performed for about 10 seconds (s) to about 30 s.

Figure 2:
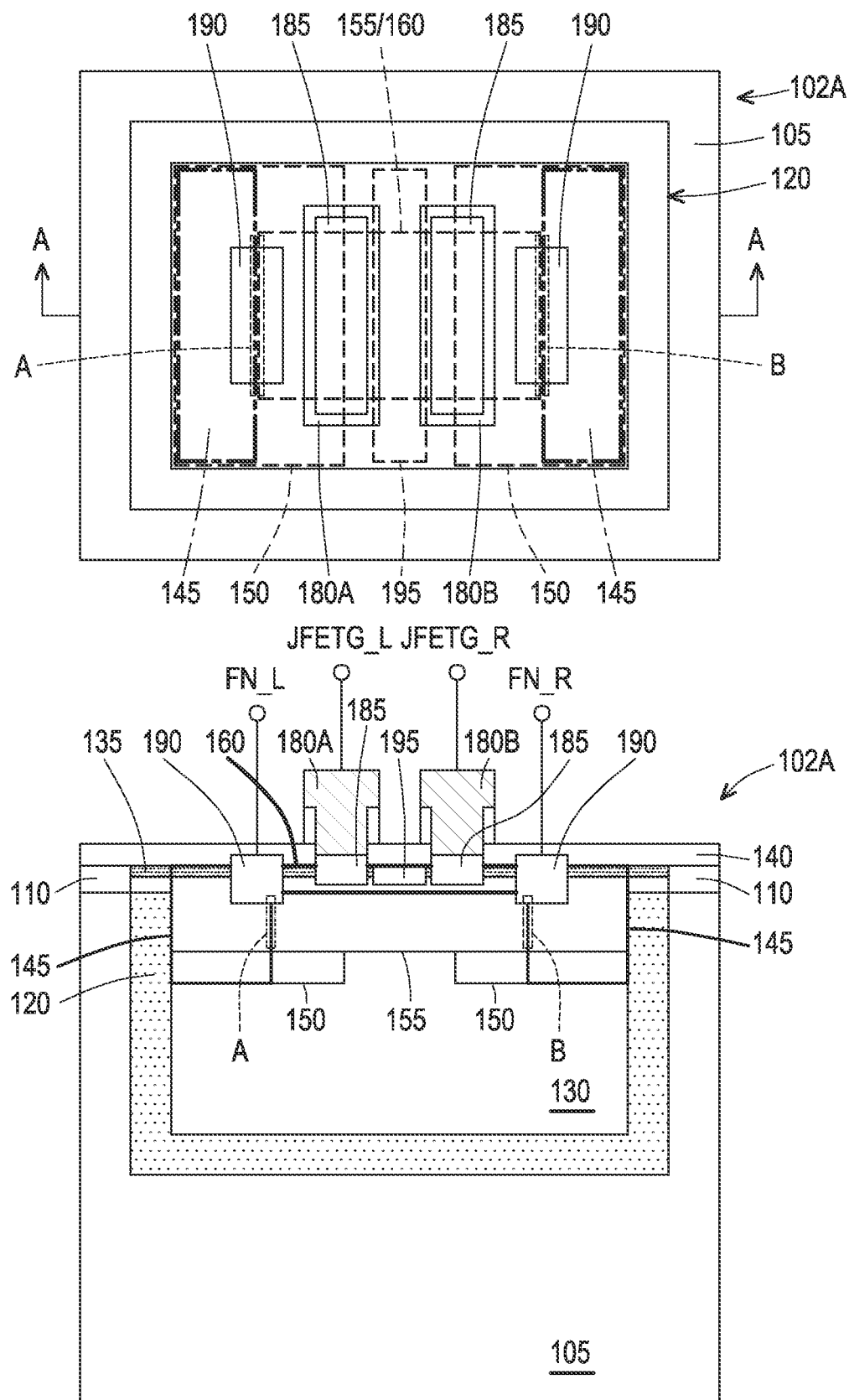
FIG. 2 is a diagrammatic top view and a diagrammatic cross-sectional view of a photosensitive device, such as the photosensitive device of FIGS. 1A-1J, in portion or entirety, according to various aspects of the present disclosure.

FIG. 2 provides a diagrammatic top view and a diagrammatic cross-sectional view of one device region, such as device region 102A, of photosensitive device 100 along line A-A of the top view, in portion or entirety, after undergoing fabrication associated with FIGS. 1A-1J and, in some embodiments, additional fabrication, according to various aspects of the present disclosure. For ease of understanding, oxide layer 140 and cap layer 135 are omitted from the top view of FIG. 2. Device region 102A includes a germanium-based sensor having a germanium photodiode that can convert photons (e.g., electromagnetic radiation, such as light) into charge carriers (e.g., electrons and/or holes), which can be measured as current and/or voltage. The germanium photodiode is located in silicon substrate 105. For example, germanium layer 130 is wrapped by silicon substrate 105 (e.g., silicon substrate 105 is disposed along sidewalls and bottoms of germanium layer 130), and germanium layer 130 has a laterally diffused photodiode (LD-PD) formed therein by p-n junctions between second type doped region 155 and first type doped regions 145, such as a p-n junction A (which can be referred to as a left p-n junction) and a p-n junction B (which can be referred to as a right p-n junction). A first, left floating voltage node (FN_L) and a second, right floating voltage node (FN_R) are connected to respective second type doped regions 190, such that p-n junction A and p-n junction B are electrically connected to first, left floating voltage node and second, right floating voltage node by respective second type doped regions 190. Leakage current (also referred to as dark current) from the germanium photodiode is reduced by inserting doped silicon layer 120 between germanium layer 130 and silicon substrate 105. In some embodiments, the leakage current can potentially be reduced by as much as 1000% compared to conventional germanium-based sensors, which do not have a doped silicon layer between a germanium photodiode and a silicon substrate. The germanium-based sensor in device region 102A further has a double-gate junction field effect transistor (JFET), which improves control of the germanium photodiode. For example, gates of the double-gate JFET are provided by polysilicon gate 180A (and underlying first type doped region 185) and polysilicon gate 180B (and underlying first type doped region 185), a channel of the double-gate JFET is provided by second type doped region 155 (P-channel or N-channel (also be referred to as a channel layer and/or a JFET channel)), and source/drain regions of the double-gate JFET are provided by second type doped regions 190 (P+ regions or N+ regions (also referred to as source/drain regions). A first, left gate voltage node (JFETG_L) and a second, right gate voltage node (JFETG_R) are connected to polysilicon gate 180A and polysilicon gate 180B, respectively. In the germanium-based sensor, first type doped region 160 functions as a passivation layer for the LD-PD, which reduces leakage current at a surface of the germanium photodiode, and first type doped region 195 is a pinned photodiode (PPD) (e.g., n-type PPD (NPPD) or p-type (PPPD)) that provides additional passivation for the LD-PD, further reducing leakage current at the surface of the germanium photodiode. Further, first type doped regions 150 function as electron lenses (e-lenses) in the germanium-based sensor, which increases optical fill factor (FF) of the germanium-based sensor. For example, first type doped regions 150 (i.e., e-lenses) can effectively guide or direct light to the LD-PD as well as metal light guiding structures, eliminating the need for the germanium-based sensor to have backside metal light guiding structures (i.e., a metal grid over a back surface of silicon substrate 105 to guide the light to the LD-PD), which provides the germanium-based sensor with a greater area upon which light can be guided to the LD-PD (and thus greater photosensitive area) compared to conventional sensors and thus improves optical fill factor. By reducing leakage current of the germanium photodiode, increasing optical fill factor of the germanium photodiode, and/or improving control of the germanium photodiode with the double-gate JFET, the germanium-based sensor with JFET exhibits better sensitivity, better conversion gain, and/or less noise than conventional germanium-based sensors. In some embodiments, the germanium-based sensor with JFET is a hole-sensing sensor. In such embodiments, first type doped regions 145, first type doped regions 150, first type doped regions 160, first type doped regions 185, and first type doped regions 195 are n-doped regions, while second type doped regions 155 and second type doped regions 190 are p-doped regions. In furtherance of such embodiments, polysilicon gates 180A and polysilicon gates 180B are n-doped polysilicon gates. In some embodiments, the germanium-based sensor with JFET is an electron-sensing sensor. In such embodiments, first type doped regions 145, first type doped regions 150, first type doped regions 160, first type doped regions 185, and first type doped regions 195 are p-doped regions, while second type doped regions 155 and second type doped regions 190 are n-doped regions. In furtherance of such embodiments, polysilicon gates 180A and polysilicon gates 180B are p-doped polysilicon gates. Different embodiments may have different advantages, and no particular advantage is required of any embodiment. FIG. 2 has been simplified for the sake of clarity to better understand the inventive concepts of the present disclosure. Additional features can be added in device region 102A of photosensitive device 100, and some of the features described below can be replaced, modified, or eliminated in other embodiments of device region 102A of photosensitive device 100.

Figure 3A:
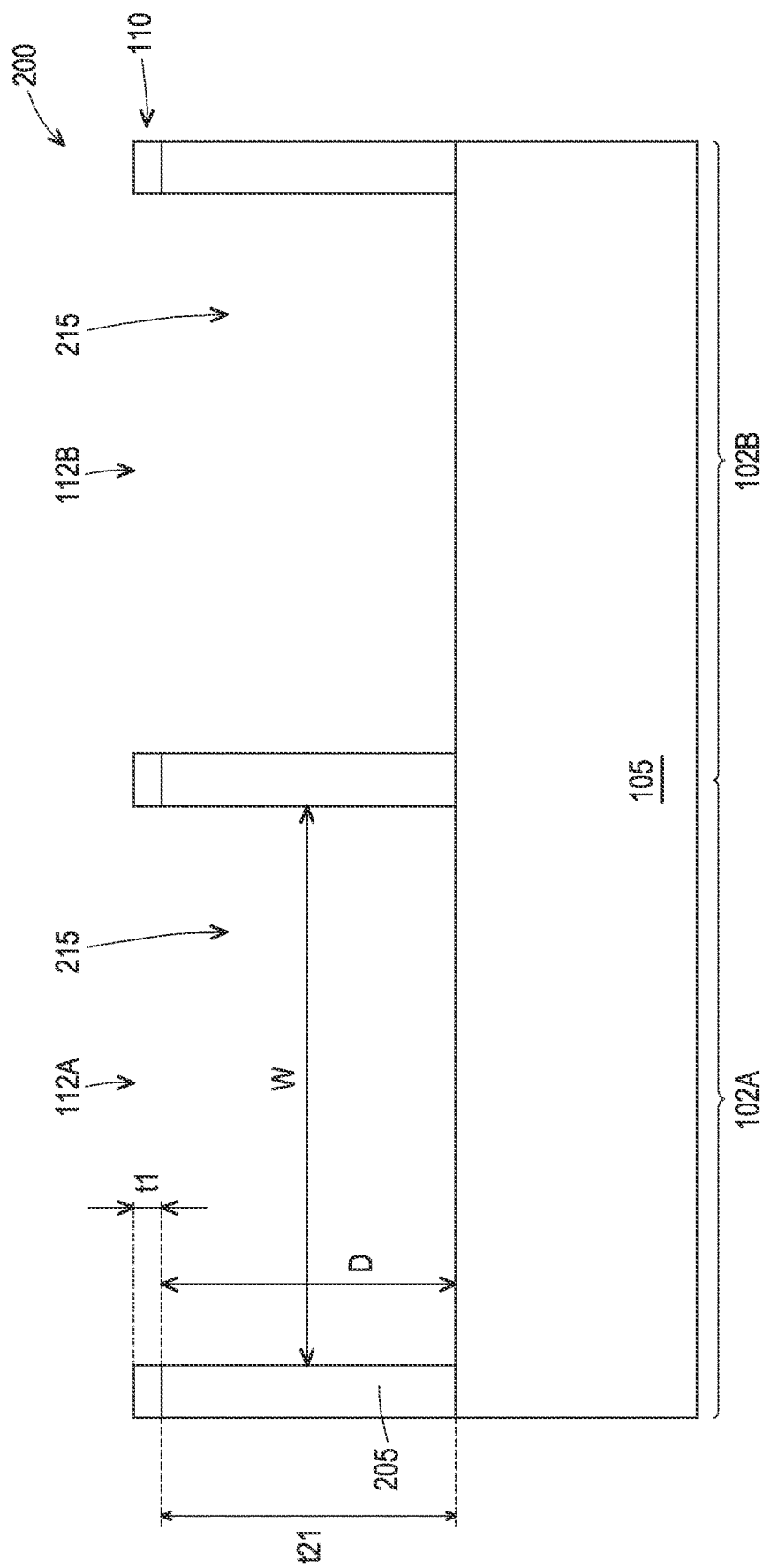
FIGS. 3A-3J are diagrammatic cross-sectional views of a photosensitive device, such as a germanium-based sensor with junction-gate field effect transistor, in portion or entirety, at various fabrication stages according to various aspects of the present disclosure.
Figure 3B:
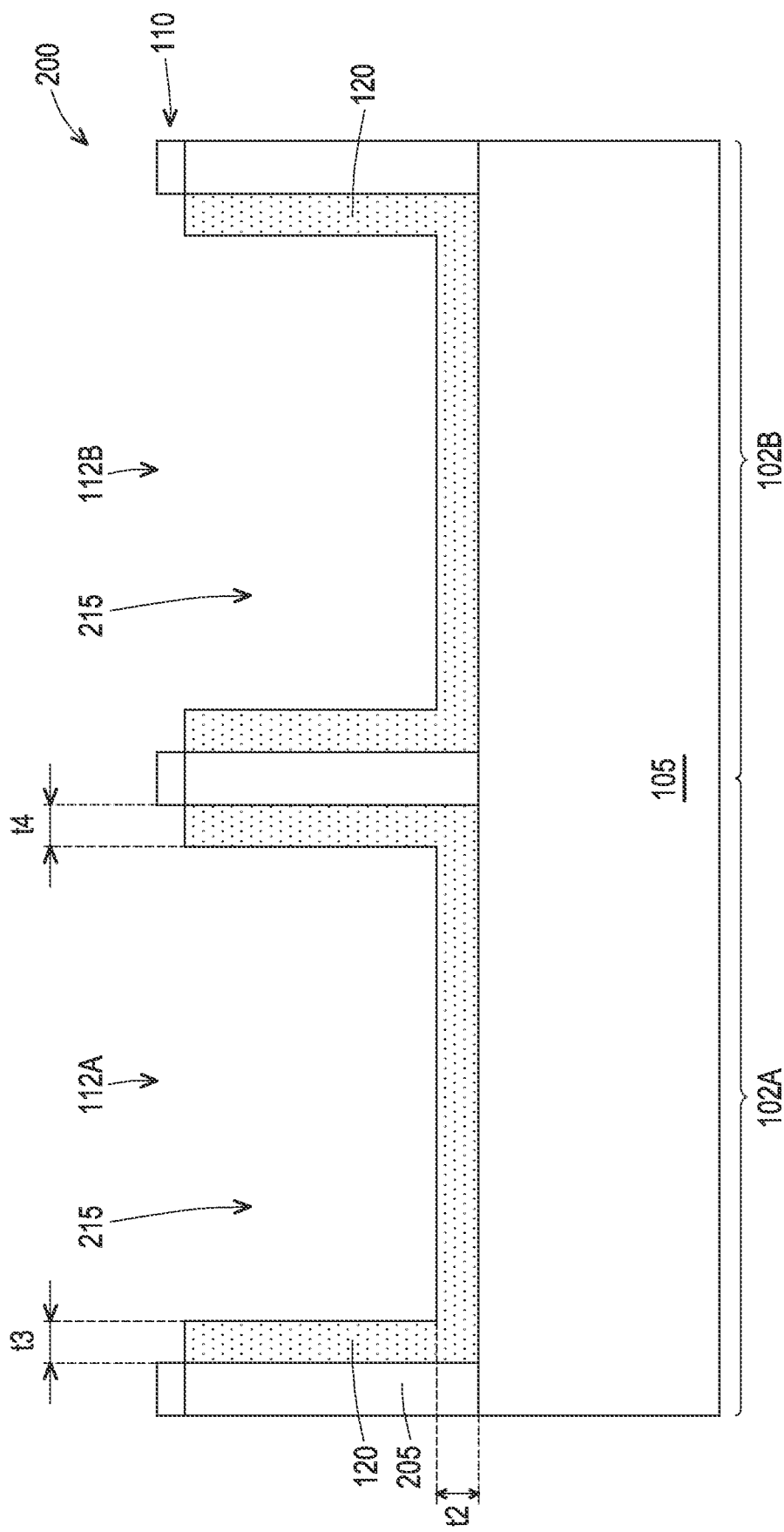
Figure 3C:
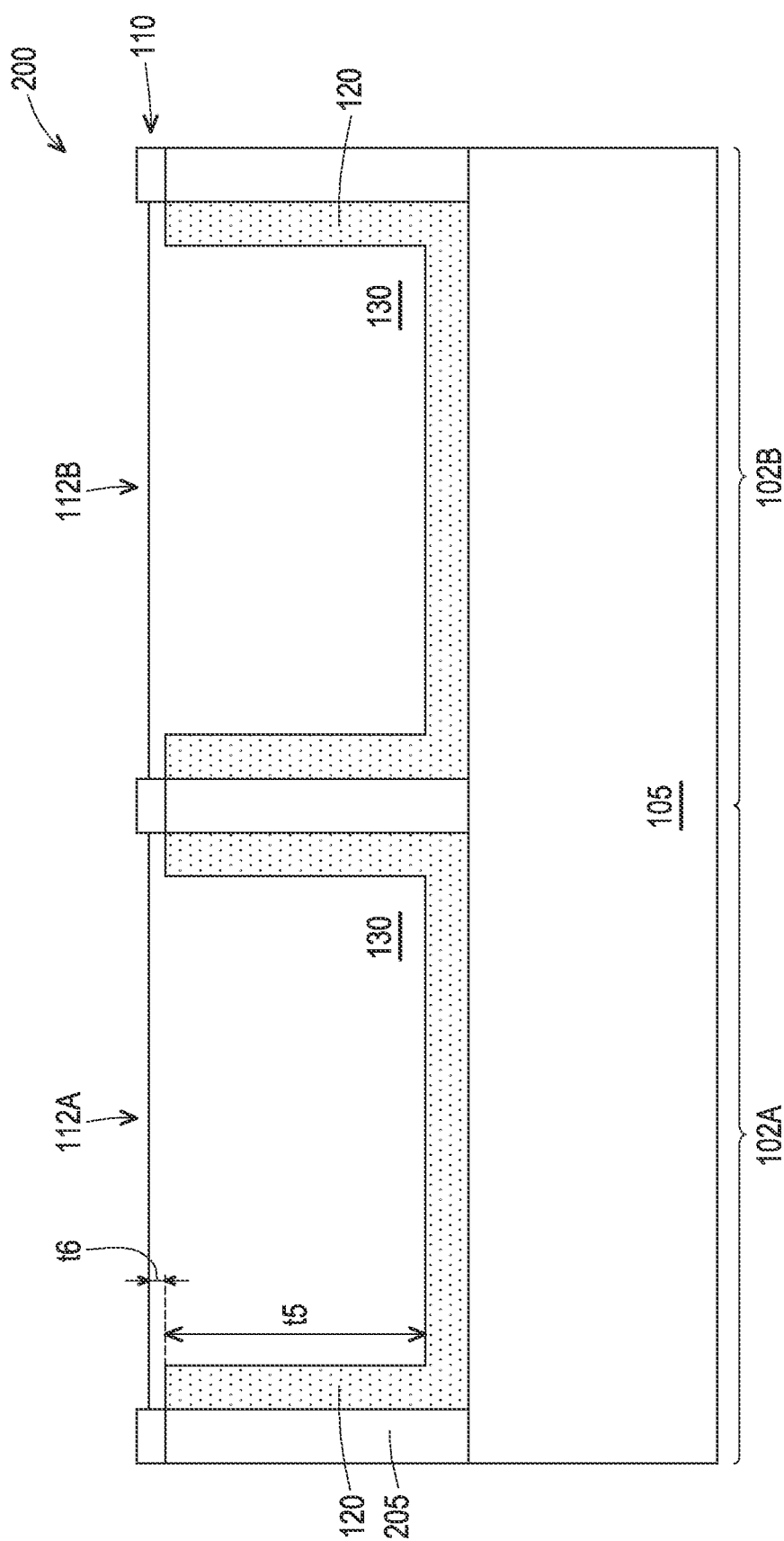
Figure 3D:
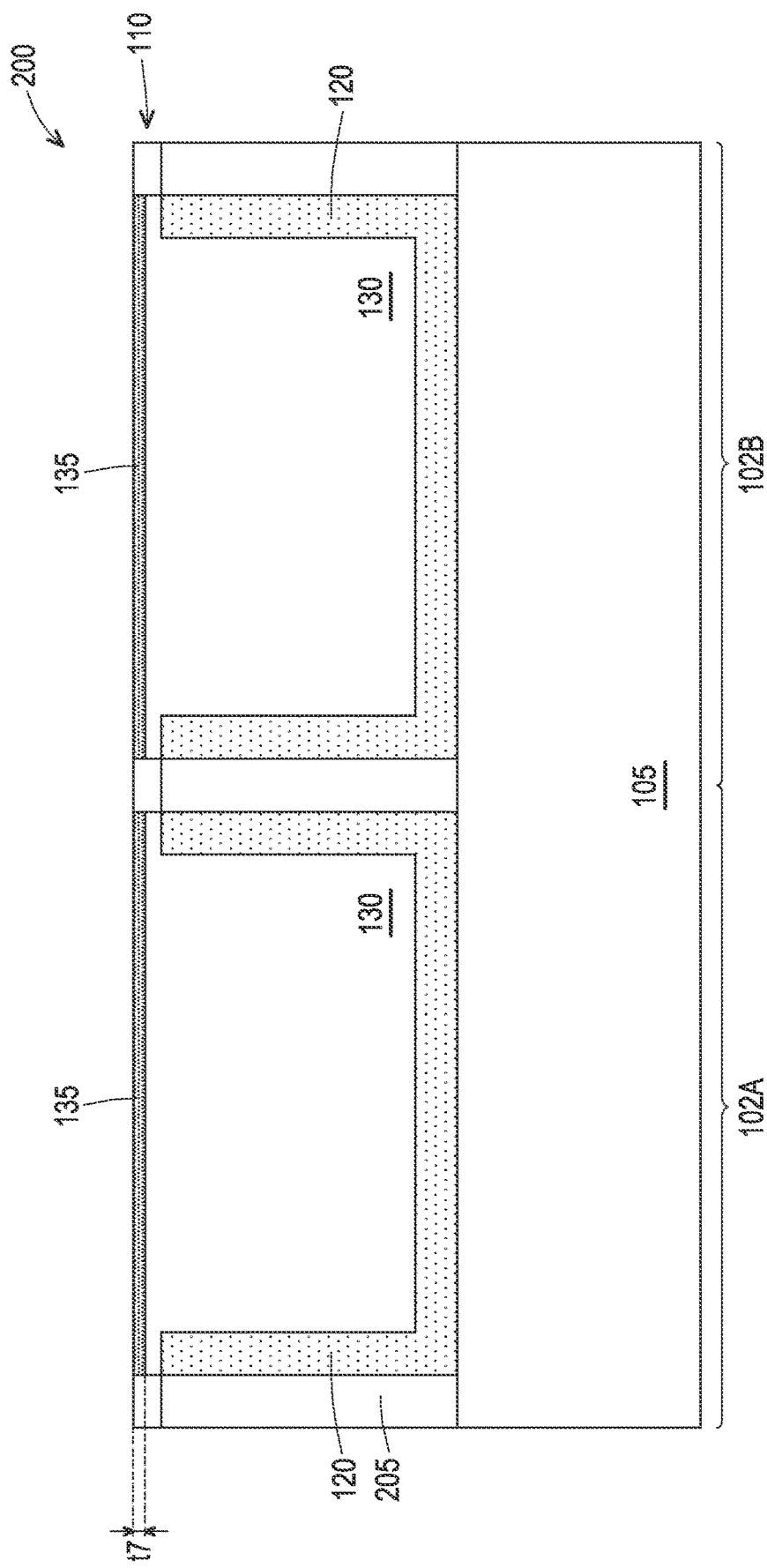
Figure 3E:
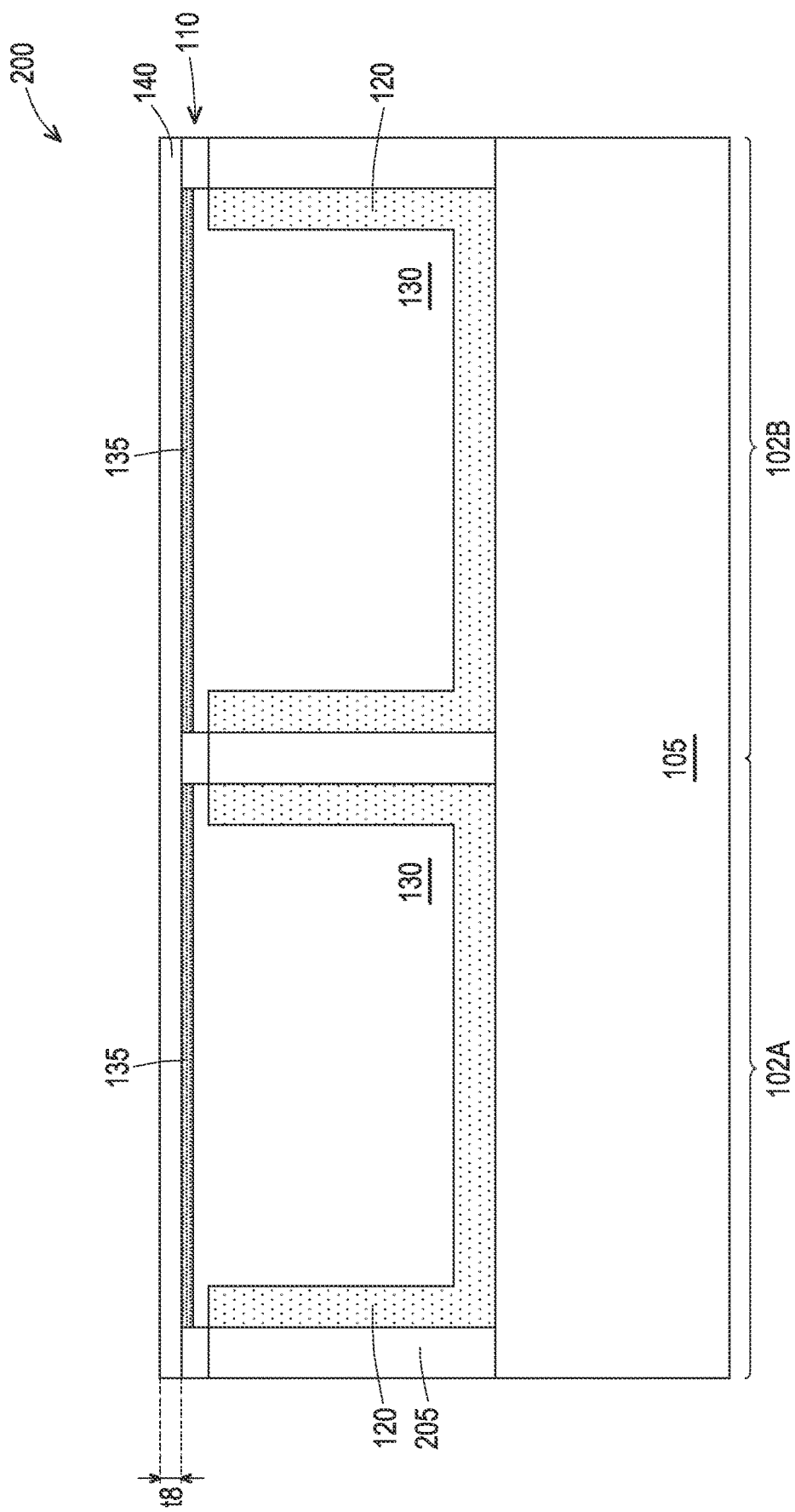
Figure 3F:
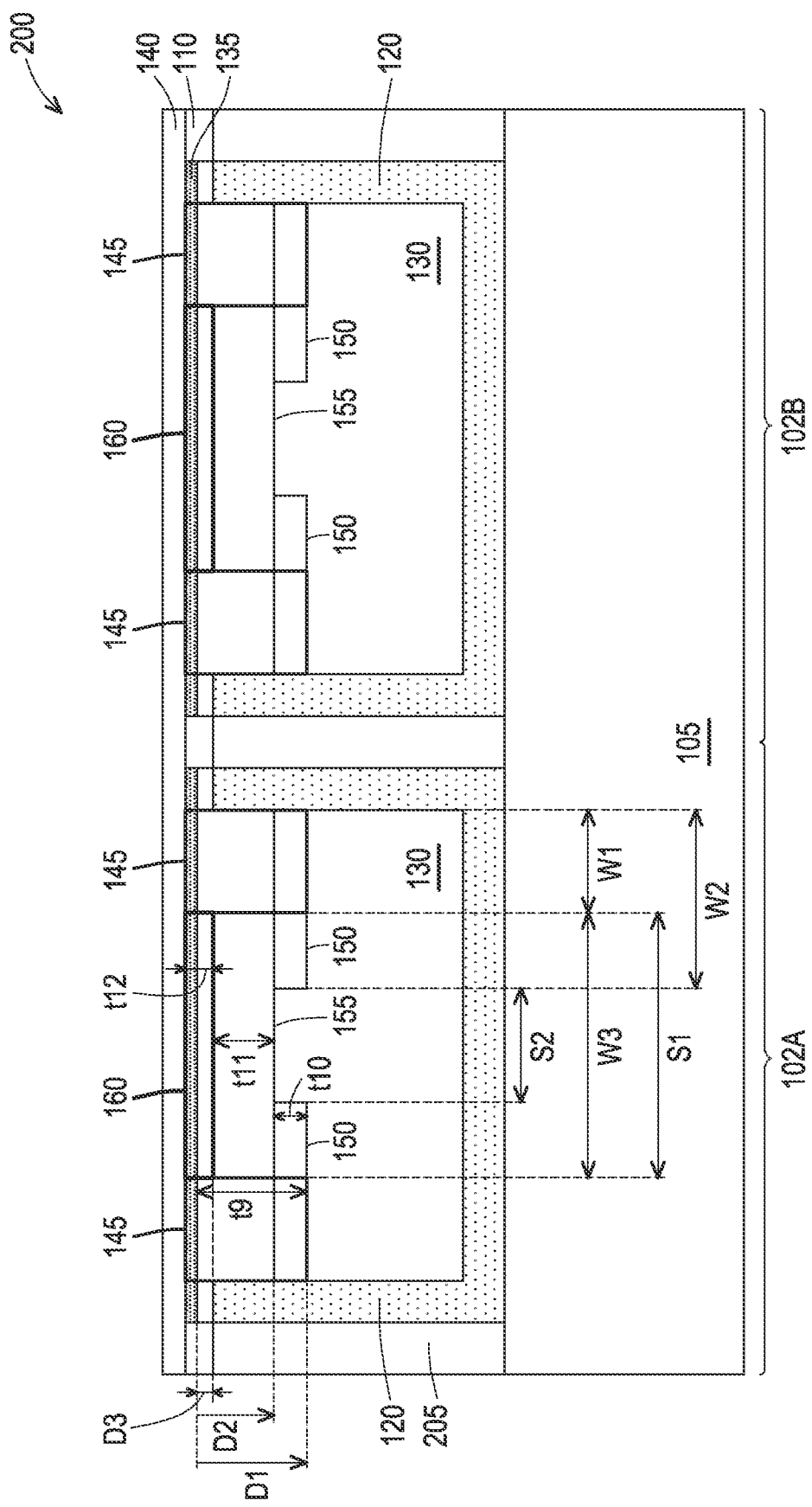
Figure 3G:
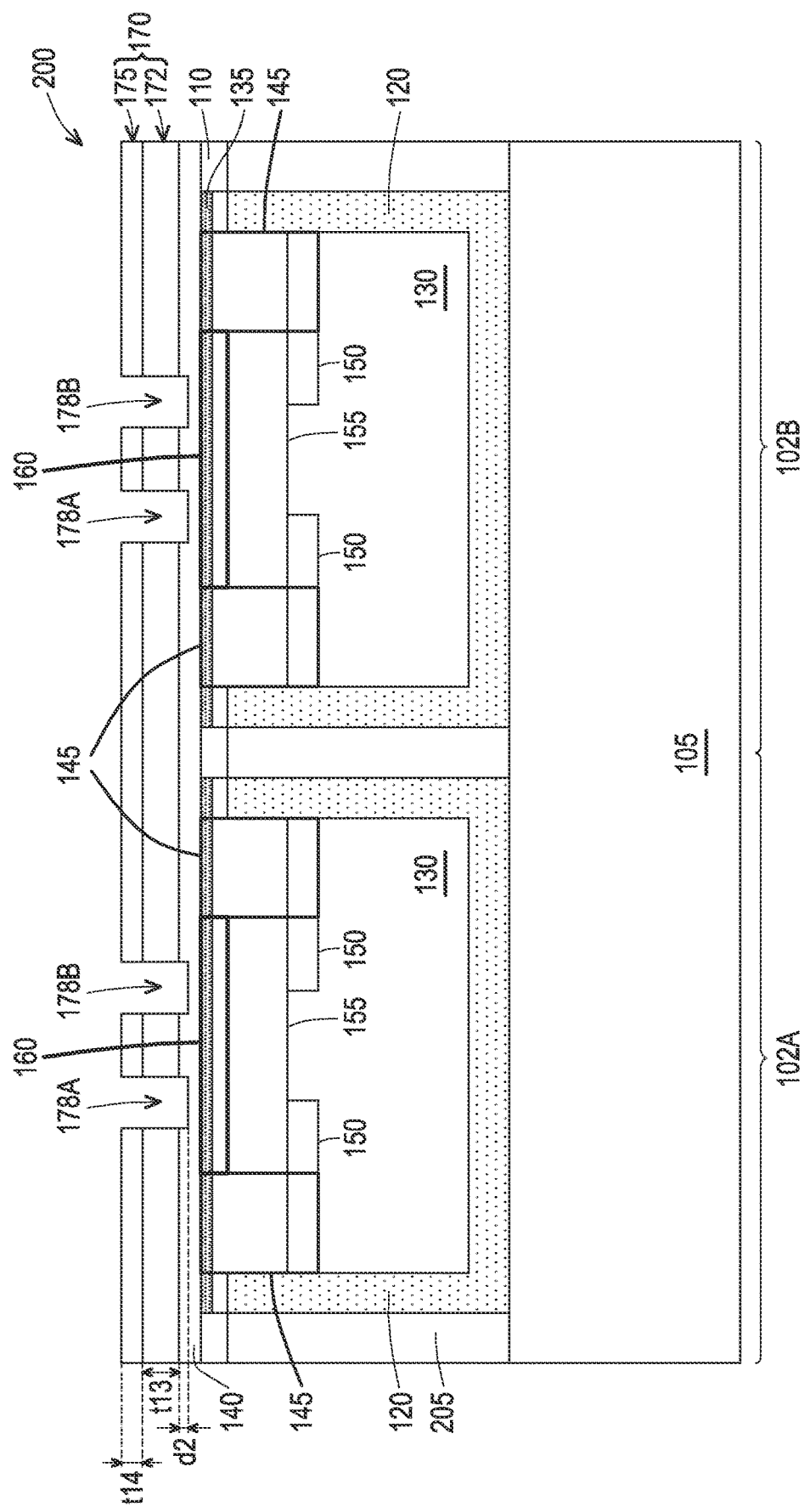
Figure 3H:
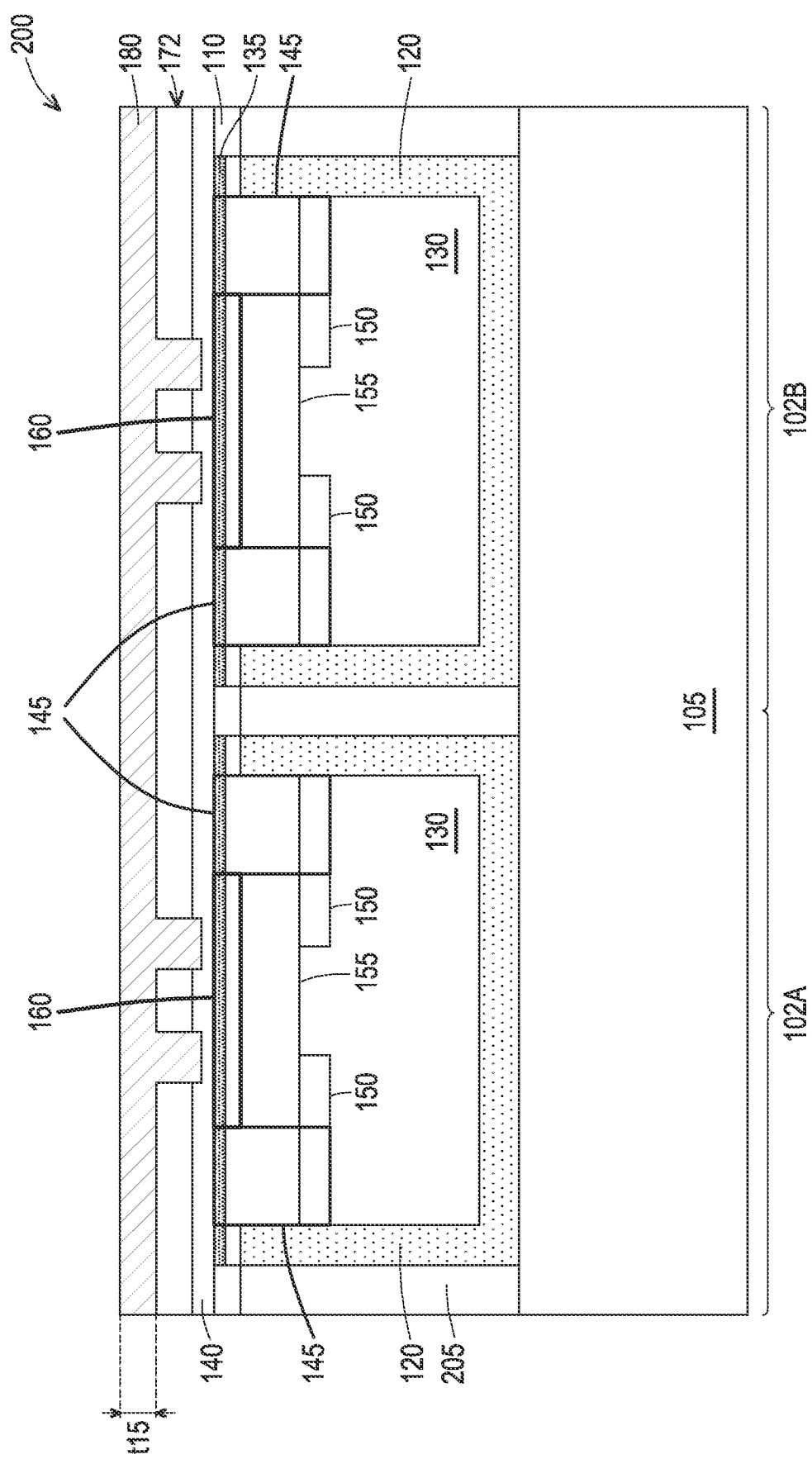
Figure 3I:
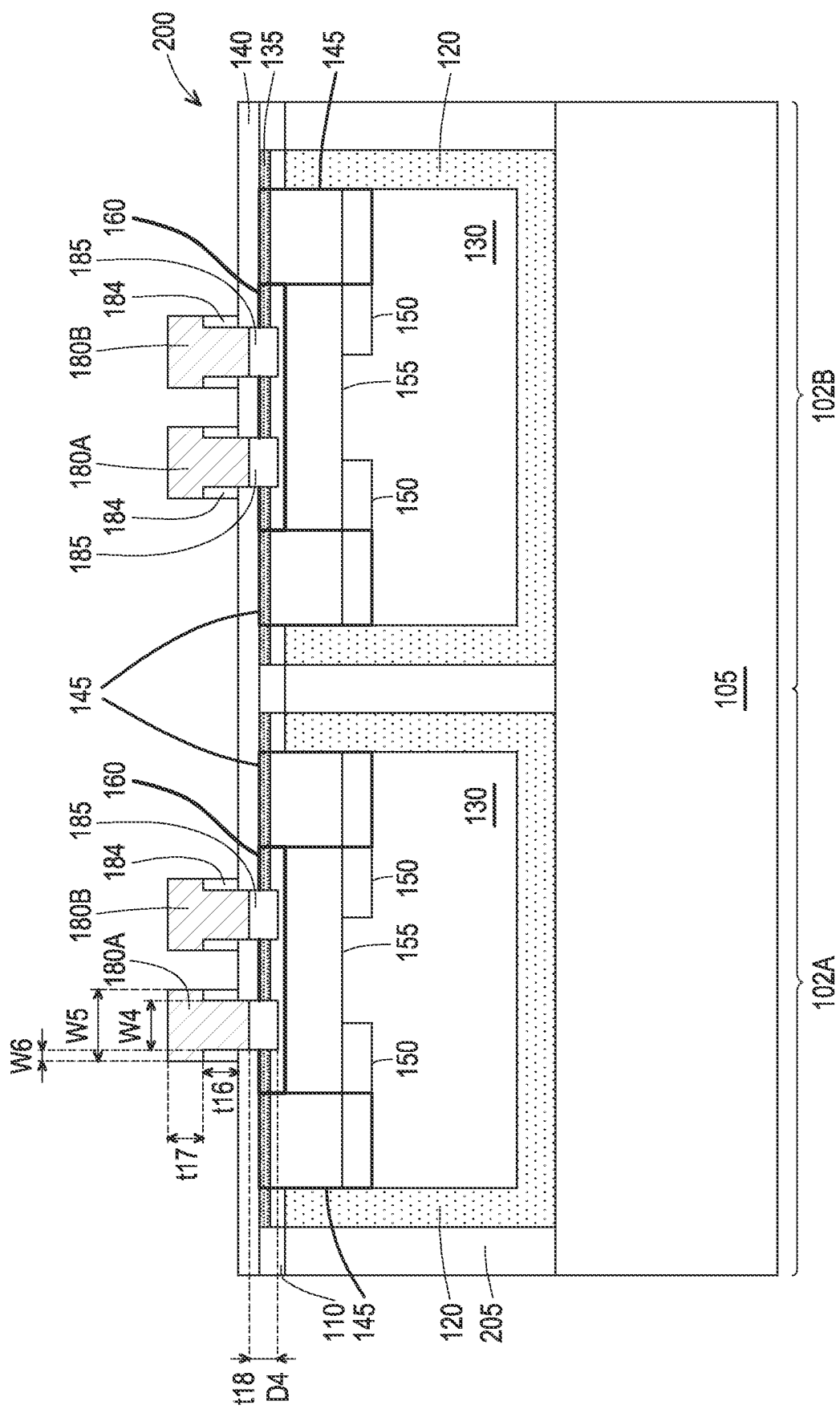
Figure 3J:
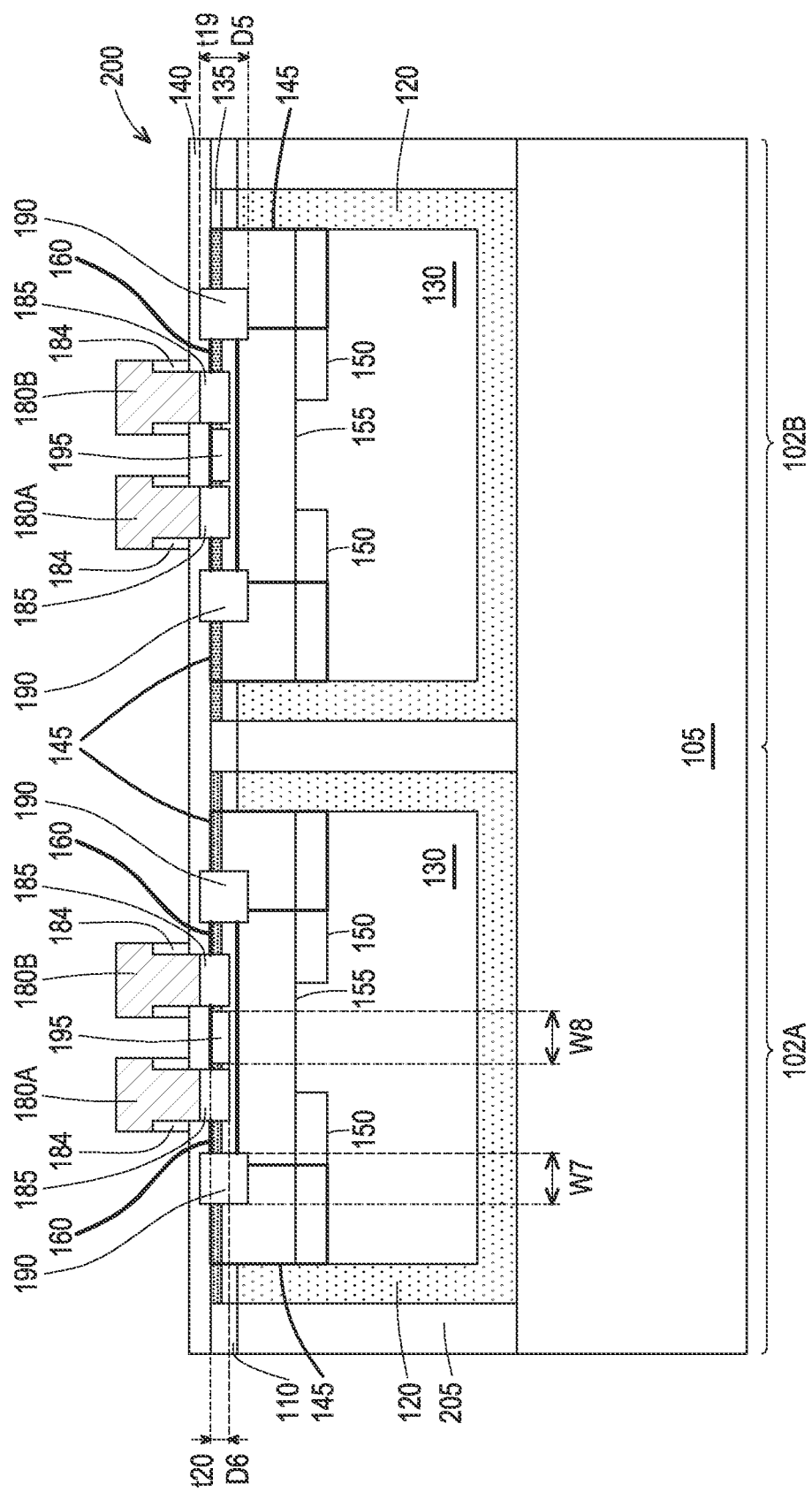

FIGS. 3A-3J are diagrammatic cross-sectional views of a photosensitive device 200, such as a germanium-based sensor with junction-gate field effect transistor, in portion or entirety, at various fabrication stages according to various aspects of the present disclosure. For clarity and simplicity, similar features of photosensitive device 100 in FIGS. 1A-1J and photosensitive device 200 in FIGS. 3A-3J are identified by the same reference numerals. Fabrication of photosensitive device 200 in FIGS. 3A-3J is similar in many respects to fabrication of photosensitive device 100 in FIGS. 1A-1J, except the germanium photodiode of photosensitive device 200 is fabricated and located on silicon substrate 105, instead of in silicon substrate 105. For example, turning to FIG. 3A, fabrication begins with receiving silicon substrate 105, depositing an oxide layer 205 over silicon substrate 105, and forming cavities 215 in oxide layer 205. Oxide layer 205 includes oxygen and, in some embodiments, another suitable constituent. For example, oxide layer 205 can include silicon and oxygen (e.g., $SiO_2$) and be referred to as a silicon oxide layer. Oxide layer 205 has a thickness t21, which in some embodiments, is substantially the same as a desired depth (e.g., depth D) of cavities 215. In some embodiments, thickness t21 is about 900 nm to about 1,500 nm. Any suitable deposition process is implemented for forming oxide layer 205, such as those described herein. Any suitable lithography process and etching process, such as those described herein, are implemented for patterning oxide layer 205 to form cavities 215. In contrast to cavities 115, cavities 215 extend through oxide layer 205 and expose silicon substrate 105, such that cavities 215 have sidewalls formed by oxide layer 205 and bottoms formed by silicon substrate 105. Turning to FIGS. 3B-3J, fabrication of photosensitive device 200 then proceeds similar to photosensitive device 100, for example, by forming doped silicon layers 120 that partially fill cavities 215 (FIG. 3B), forming germanium layers 130 over doped silicon layers 120 that fill remainders of cavities 215 (FIG. 3C), forming cap layers 135 over germanium layers 130 (FIG. 3D), forming oxide layer 140 over photosensitive device 200 (FIG. 3E), forming various doped regions in germanium layers 130 (e.g., first type doped regions 145, first type doped regions 150, second type doped regions 155, and first type doped regions 160) (FIG. 3F), forming polysilicon gates 180A and polysilicon gates 180B over germanium layers 130 (FIGS. 3G-3I), forming first type doped regions 185 in germanium layers 130 (FIG. 3I), and forming second type doped regions 190 and first type doped regions 195 in germanium layers 130 (FIG. 3J). In some embodiments, the deposition process implemented to form doped silicon layers 120 in cavities 215 is a non-selective deposition process, for example, that can grow epitaxial silicon from both silicon substrate 105 and oxide layer 205. FIGS. 3A-3J have been simplified for the sake of clarity to better understand the inventive concepts of the present disclosure. Additional features can be added in photosensitive device 200, and some of the features described below can be replaced, modified, or eliminated in other embodiments of photosensitive device 200.

Figure 4:
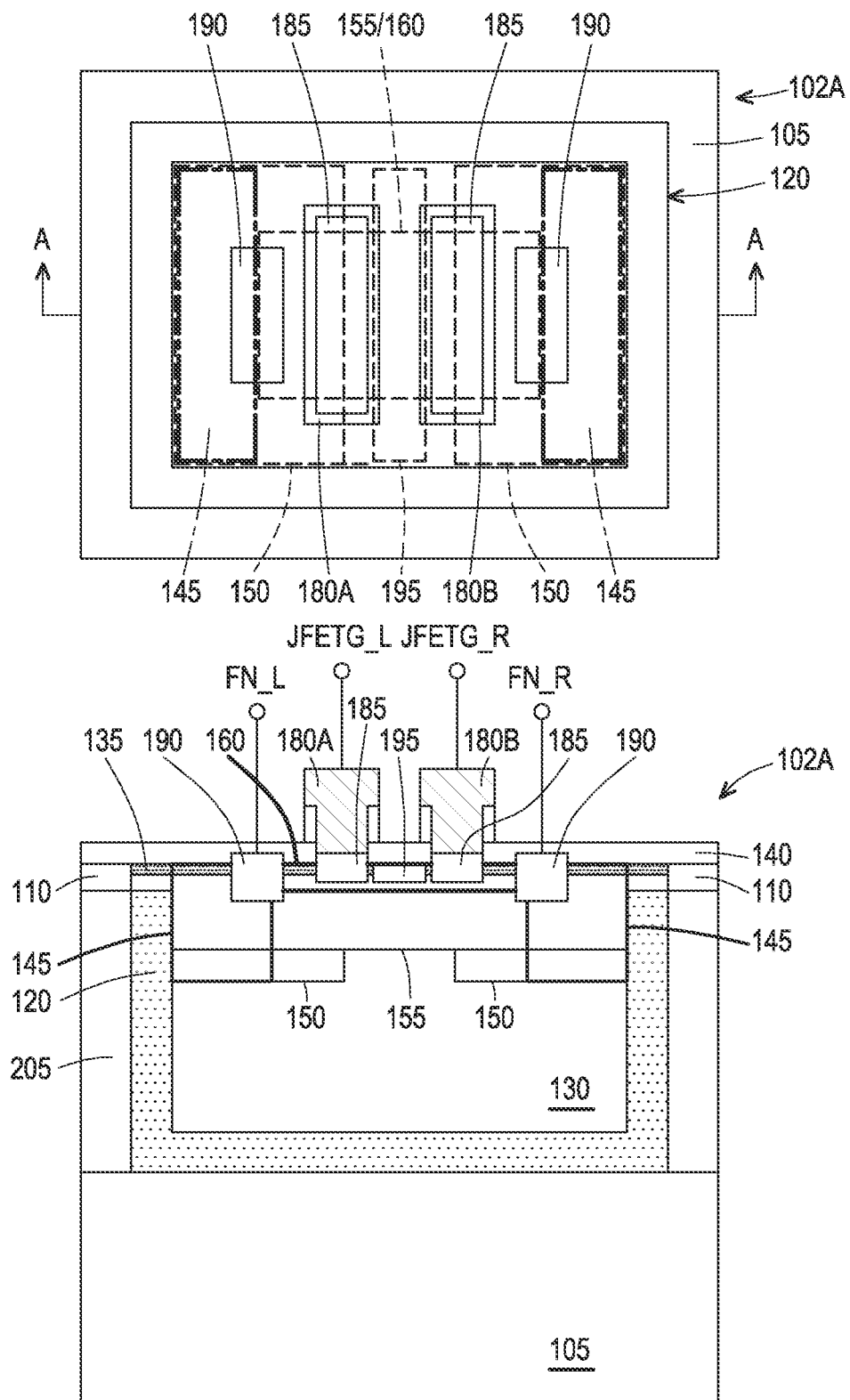
FIG. 4 is a diagrammatic top view and a diagrammatic cross-sectional view of a photosensitive device, such as the photosensitive device of FIGS. 3A-3J, in portion or entirety, according to various aspects of the present disclosure.

FIG. 4 provides a diagrammatic top view and a diagrammatic cross-sectional view of one device region, such as device region 102A, of photosensitive device 200 along line A-A of the top view, in portion or entirety, after undergoing fabrication associated with FIGS. 3A-3J and, in some embodiments, additional fabrication, according to various aspects of the present disclosure. For ease of understanding, oxide layer 140 is partially omitted and cap layer 135 is omitted from the top view of photosensitive device 200 in FIG. 4. Device region 102A of photosensitive device 200 in FIG. 4 is similar in many respects to device region 102A of photosensitive device 100 in FIG. 2. For example, device region 102A includes a germanium-based sensor that is configured to reduce leakage current of its germanium photodiode, increase optical fill factor of its germanium photodiode, and/or improve control of its germanium photodiode with a double-gate JFET, such that the germanium-based sensor exhibits better sensitivity than conventional germanium-based sensors. Further, in photosensitive device 200, leakage current from the germanium photodiode is further reduced by isolating sidewalls of the germanium photodiode with oxide layer 205. Different embodiments may have different advantages, and no particular advantage is required of any embodiment. FIG. 4 has been simplified for the sake of clarity to better understand the inventive concepts of the present disclosure. Additional features can be added in device region 102A of photosensitive device 200, and some of the features described below can be replaced, modified, or eliminated in other embodiments of device region 102A of photosensitive device 200.

Figure 5:
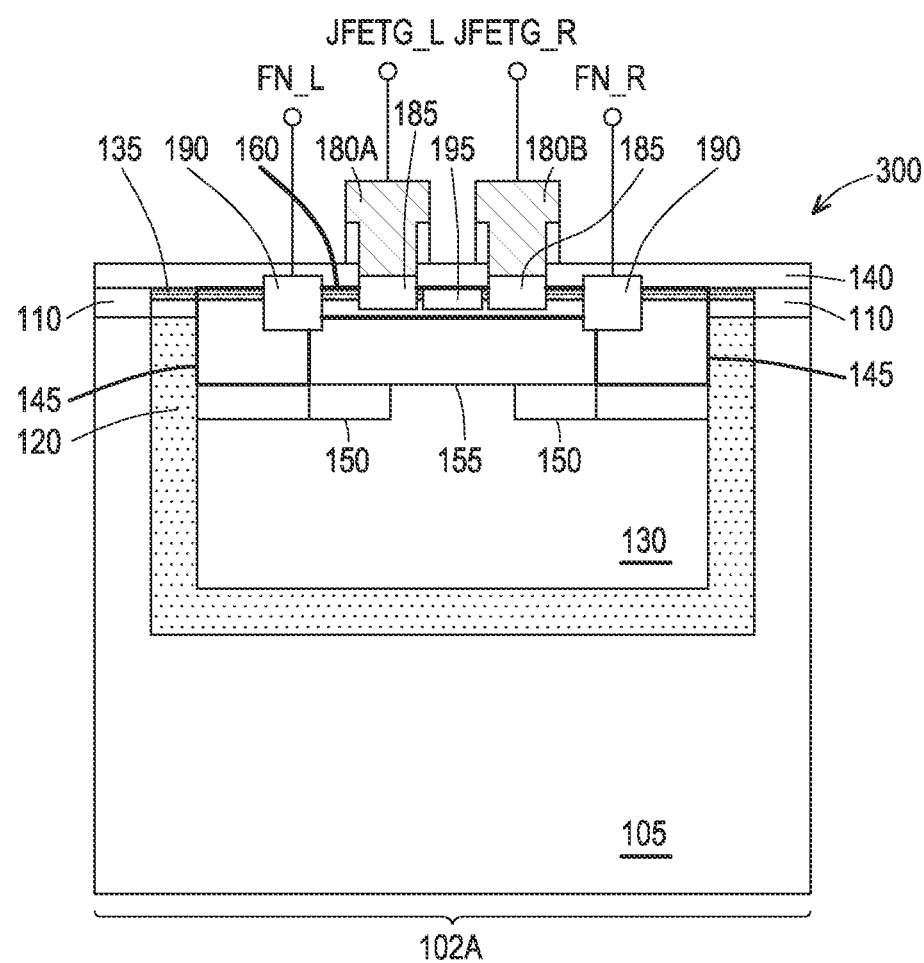
FIG. 5 is a diagrammatic cross-sectional view of a photosensitive device, such as a germanium-based sensor with junction-gate field effect transistor, in portion or entirety, according to various aspects of the present disclosure.

FIG. 5 is a diagrammatic cross-sectional view of a photosensitive device 300, in portion or entirety, according to various aspects of the present disclosure. For clarity and simplicity, similar features of photosensitive device 100 in FIGS. 1A-1J and photosensitive device 300 in FIG. 5 are identified by the same reference numerals. Photosensitive device 300 is similar in many respects to photosensitive device 100, except first type doped regions 145 do not overlap first type doped regions 150. For example, first type doped regions 145 extend to depth D2 in germanium layers 130, instead of depth D3 in germanium layers 130, such that first doped regions 145 and first type doped regions 150 have interfaces at depth D2 in germanium layers 130. FIG. 5 has been simplified for the sake of clarity to better understand the inventive concepts of the present disclosure. Additional features can be added in photosensitive device 300, and some of the features described below can be replaced, modified, or eliminated in other embodiments of photosensitive device 300.

Figure 6:
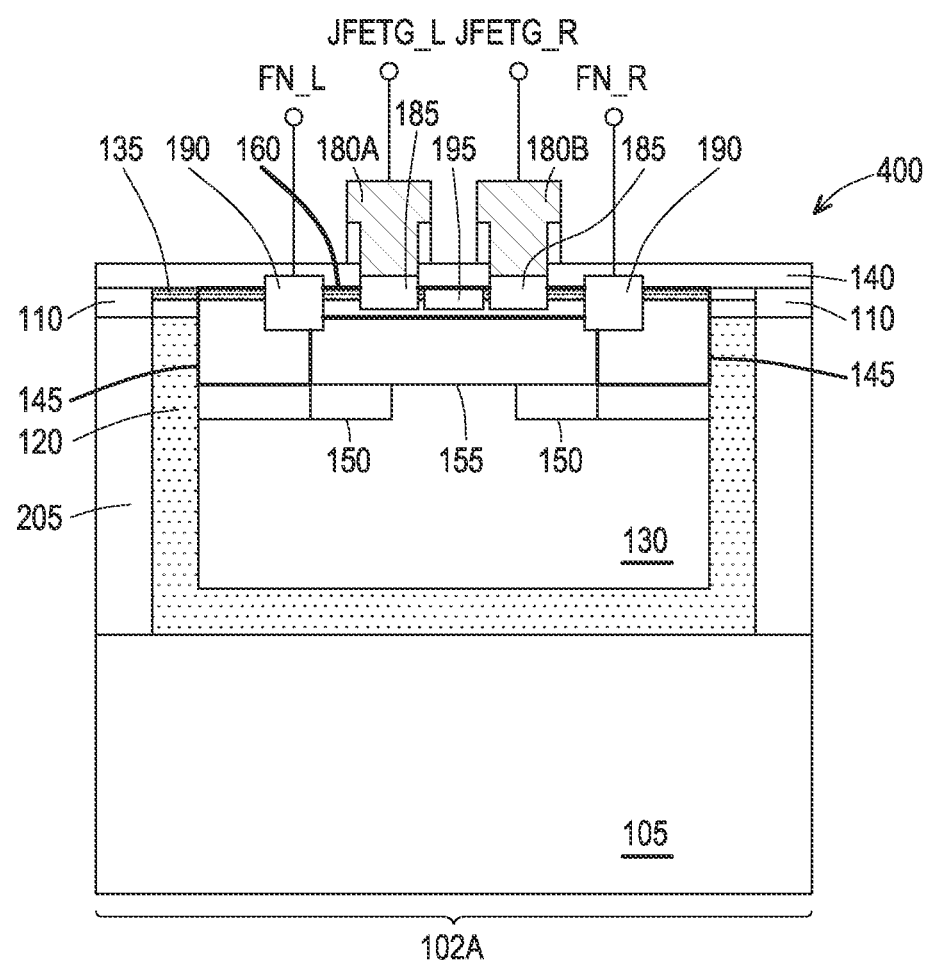
FIG. 6 is a diagrammatic cross-sectional view of a photosensitive device, such as a germanium-based sensor with junction-gate field effect transistor in portion or entirety, according to various aspects of the present disclosure.

FIG. 6 is a diagrammatic cross-sectional view of a photosensitive device 400, in portion or entirety, according to various aspects of the present disclosure. For clarity and simplicity, similar features of photosensitive device 200 in FIGS. 3A-3J and photosensitive device 400 in FIG. 6 are identified by the same reference numerals. Photosensitive device 400 is similar in many respects to photosensitive device 200, except first type doped regions 145 do not overlap first type doped regions 150. For example, first type doped regions 145 extend to depth D2 in germanium layers 130, instead of depth D3 in germanium layers 130, such that first doped regions 145 and first type doped regions 150 have interfaces at depth D2 in germanium layers 130. FIG. 6 has been simplified for the sake of clarity to better understand the inventive concepts of the present disclosure. Additional features can be added in photosensitive device 400, and some of the features described below can be replaced, modified, or eliminated in other embodiments of photosensitive device 400.

Figure 7:
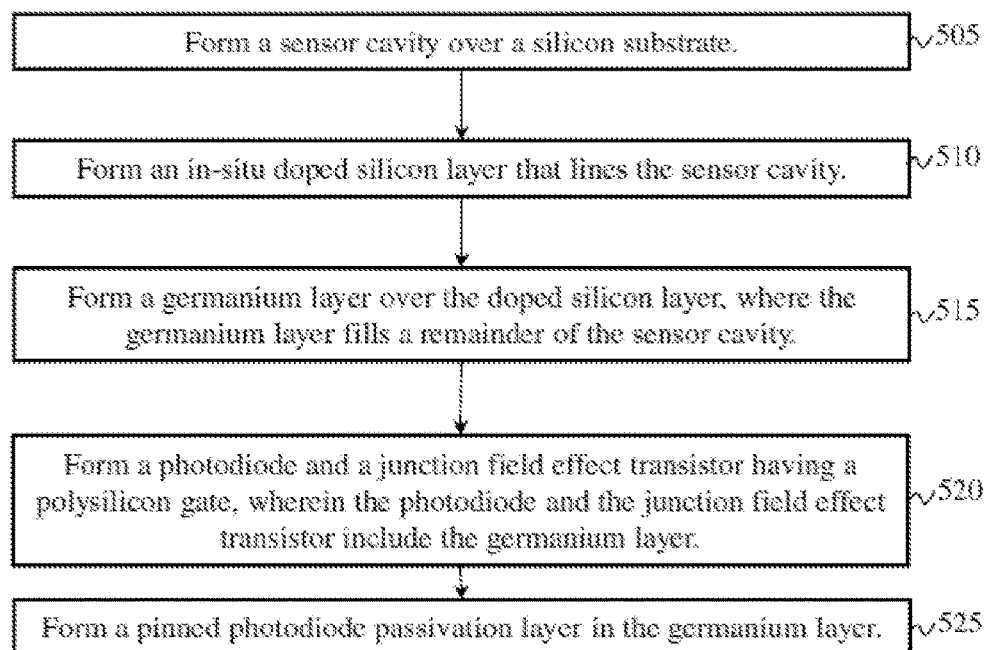
FIG. 7 is a flow chart of a method for fabricating a photosensitive device, such as the photosensitive devices depicted in FIGS. 1A-1J, FIG. 2, FIGS. 3A-3J, FIG. 4, FIG. 5, and FIG. 6, in portion or entirety, according to various aspects of the present disclosure.

FIG. 7 is a flow chart of a method 500 for fabricating a photosensitive device, such as those depicted in FIGS. 1A-1J, FIG. 2, FIGS. 3A-3J, FIG. 4, FIG. 5, and FIG. 6, in portion or entirety, according to various aspects of the present disclosure. Method 500 begins with forming a sensor cavity over a silicon substrate at block 505. Method 500 proceeds with forming an in-situ doped silicon layer that partially fills and lines the sensor cavity at block 510, forming a germanium layer over the doped silicon layer that fills a remainder of the sensor cavity at block 515, forming a photodiode and a junction field effect transistor that include the germanium layer (where the junction field effect transistor has a polysilicon gate) at block 520, and forming a pinned photodiode passivation layer in the germanium layer at block 525. In some embodiments, self-diffusion is used to form a diffusion region under the polysilicon gate. For example, method 500 includes performing an anneal process on the polysilicon gate. FIG. 5 has been simplified for the sake of clarity to better understand the inventive concepts of the present disclosure. Additional steps can be provided before, during, and after method 500, and some of the steps described can be moved, replaced, or eliminated for additional embodiments of method 500.

The various doped regions described herein, such as first type doped regions 145, first type doped regions 150, second type doped regions 155, first type doped regions 160, first type doped regions 185, second type doped regions 190, and first type doped regions 195, can include both first type dopant and second type dopant, where a doped region is considered a first type doped region where a first type dopant concentration of the first type dopant is greater than a second type dopant concentration of the second type dopant (and thus provides a doped region having a first conductivity) and a second type doped region where the first type dopant concentration of the first type dopant is less than the second type dopant concentration of the second type dopant (and thus provides a doped region having a second conductivity).

The present disclosure provides for many different embodiments, including hole-sensing photosensitive devices and electron-sensing photosensitive devices, such as those described herein. The disclosed photosensitive devices have double-gate junction field effect transistors to improve control and various doped regions to improve performance, such as e-lenses for increasing optical fill factor, and/or channel layer and/or passivation layers that reduce leakage current and thereby improve performance.

An exemplary photosensitive device includes a silicon substrate, a germanium layer disposed over the silicon substrate, and a doped silicon layer disposed between the silicon substrate and the germanium layer. The photosensitive device further includes a first doped region, a second doped region, and a third doped region disposed in the germanium layer. The first doped region is disposed between the second doped region and the third doped region. The first doped region includes a first type dopant. The second doped region and the third doped region include a second type dopant. The photosensitive device further includes a fourth doped region, a fifth doped region, and a sixth doped region disposed in the germanium layer. The fourth doped region overlaps a first interface between the first doped region and the second doped region. The fifth doped region overlaps a second interface between the first doped region and the third doped region. The sixth doped region is disposed over the first doped region and between the fourth doped region and the fifth doped region. The fourth doped region and the fifth doped region include the first type dopant, and the sixth doped region includes the second type dopant. The photosensitive device further includes a polysilicon gate disposed over the sixth doped region. The polysilicon gate includes the second type dopant. The photosensitive device further includes a seventh doped region disposed in the germanium layer under the polysilicon gate. The seventh doped region includes the second type dopant.

In some embodiments, the first type dopant is n-type dopant and the second type dopant is p-type dopant. In some embodiments, the first type dopant is p-type dopant and the second type dopant is n-type dopant. In some embodiments, doped silicon layer is disposed between the silicon substrate and sidewalls of the germanium layer and between the silicon substrate and a bottom of the germanium layer. In some embodiments, the doped silicon layer is further disposed between an oxide layer and the germanium layer. In some embodiments, the doped silicon layer is disposed between the oxide layer and sidewalls of the germanium layer and between the silicon substrate and a bottom of the germanium layer.

In some embodiments, the photosensitive device further includes an eighth doped region and a ninth doped region disposed in the germanium layer. The second doped region is disposed over the eighth doped region. The third doped region is disposed over the ninth doped region. The first doped region is disposed over the eighth doped region and the ninth doped region. The eighth and the ninth doped region include the second type dopant. In some embodiments, the second doped region and the third doped region overlap the eighth doped region and the ninth doped region, respectively. In some embodiments, wherein the polysilicon gate is a first polysilicon gate and the photosensitive device further includes a second polysilicon gate disposed over the sixth doped region and an eighth doped region disposed in the germanium layer under the second polysilicon gate. The first polysilicon gate and the second polysilicon gate are disposed between the fourth doped region and the fifth doped region. The second polysilicon gate includes the second type dopant. The seventh doped region includes the second type dopant. In such embodiments, the photosensitive device can further include a ninth doped region disposed in the germanium layer between the first polysilicon gate and the second polysilicon gate. The ninth doped region includes the second type dopant.

Another exemplary photosensitive device includes a silicon substrate and a germanium-based photodiode having a germanium layer disposed over the silicon substrate. The germanium-based photodiode further has two first doped regions of a first conductivity type disposed in the germanium layer; two second doped regions of the first conductivity type disposed in the germanium layer over the two first doped regions, respectively; a third doped region of a second conductivity type disposed in the germanium layer over the two first doped regions and between the two second doped regions; and a fourth doped region of the first conductivity type disposed in the germanium layer over the third doped region. A doped silicon layer is disposed between and separates the silicon substrate and the germanium layer of the germanium-based photodiode. The photosensitive device further includes two doped polysilicon gates disposed over the third doped region. The fourth doped region is disposed between the two doped polysilicon gates. In some embodiments, the first conductivity type is n-type and the second conductivity type is p-type. In some embodiments, the first conductivity type is p-type and the second conductivity type is n-type. In some embodiments, the photosensitive device further includes a silicon cap layer disposed over the germanium layer. In such embodiments, the two second doped regions and the fourth doped region are further disposed in the silicon cap layer. In some embodiments, the photosensitive device further includes two fifth doped regions of the first conductivity type disposed in the germanium layer under the two doped polysilicon gates, respectively. In some embodiments, the photosensitive device further includes an oxide layer disposed over the silicon substrate. In such embodiments, the doped silicon layer is further disposed between and separates the oxide layer and the germanium layer.

An exemplary method for forming a photosensitive device includes forming a sensor cavity over a silicon substrate, forming an in-situ doped silicon layer that partially fills and lines the sensor cavity, forming a germanium layer over the in-situ doped silicon layer that fills a remainder of the sensor cavity, and forming a photodiode and a junction field effect transistor that include the germanium layer. The junction field effect transistor has a polysilicon gate. In some embodiments, forming the junction field effect transistor includes performing a diffusion process to cause dopant to diffuse from the polysilicon gate into the germanium layer. In some embodiments, forming the sensor cavity includes etching the silicon substrate. In some embodiments, the method includes forming an oxide layer over the silicon substrate, where forming the sensor cavity includes etching the oxide layer to expose the silicon substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photosensitive device, the method comprising:
    forming a sensor cavity in a silicon substrate;
    forming a doped silicon layer and a germanium layer in the sensor cavity, wherein the doped silicon layer is disposed between the silicon substrate and the germanium layer;
    forming a first doped region, a second doped region, a third doped region, and a fourth doped region in the germanium layer, wherein the first doped region is between the second doped region and the third doped region, the fourth doped region is over the first doped region, the first doped region includes a first type dopant, and the second doped region, the third doped region, and the fourth doped region include a second type dopant;
    forming a gate over the germanium layer, wherein the gate is over the fourth doped region and the gate includes the second type dopant; and
    forming a fifth doped region, a sixth doped region, and a seventh doped region in the germanium layer, wherein the fifth doped region overlaps the first doped region and the second doped region, the sixth doped region overlaps the first doped region and the third doped region, the fourth doped region is between the fifth doped region and the sixth doped region, the seventh doped region is under the gate, the fifth doped region and the sixth doped region include the first type dopant, and the seventh doped region includes the second type dopant.

2. The method for forming the photosensitive device of claim 1, wherein the forming the seventh doped region in the germanium layer includes diffusing dopant from the gate into the germanium layer.

3. The method for forming the photosensitive device of claim 1, further comprising forming an eighth doped region and a ninth doped region in the germanium layer, wherein the second doped region is over the eighth doped region, the third doped region is over the ninth doped region, the first doped region is over the eighth doped region and the ninth doped region, and the eighth doped region and the ninth doped region include the second type dopant.

4. The method for forming the photosensitive device of claim 1, wherein the gate is a first gate and the method further includes forming a second gate over the fourth doped region and an eighth doped region in the germanium layer under the second gate, wherein the first gate and the second gate are disposed between the fifth doped region and the sixth doped region, and the second gate includes the second type dopant.

5. The method for forming the photosensitive device of claim 4, further comprising forming a ninth doped region in the germanium layer between the first gate and the second gate, wherein the ninth doped region includes the second type dopant.

6. The method for forming the photosensitive device of claim 1, wherein the forming the germanium layer in the sensor cavity includes epitaxially growing a germanium material on the doped silicon layer and planarizing the germanium material.

7. The method for forming the photosensitive device of claim 1, further comprising forming an undoped silicon layer over the germanium layer.

8. The method for forming the photosensitive device of claim 1, wherein the first type dopant is n-type dopant and the second type dopant is p-type dopant.

9. The method for forming the photosensitive device of claim 1, wherein the first type dopant is p-type dopant and the second type dopant is n-type dopant.

10. A method for forming a photosensitive device, the method comprising:
   forming an oxide layer over a silicon substrate;
   forming a sensor cavity in the oxide layer that exposes the silicon substrate;
   forming a doped silicon layer and a germanium layer in the sensor cavity, wherein the doped silicon layer is disposed between the silicon substrate and the germanium layer and between the oxide layer and the germanium layer;
   forming a first doped region, a second doped region, a third doped region, and a fourth doped region in the germanium layer, wherein the first doped region is between the second doped region and the third doped region, the fourth doped region is over the first doped region, the first doped region includes a first type dopant, and the second doped region, the third doped region, and the fourth doped region include a second type dopant;
   forming a gate over the germanium layer, wherein the gate is over the fourth doped region and the gate includes the second type dopant; and
   forming a fifth doped region, a sixth doped region, and a seventh doped region in the germanium layer, wherein the fifth doped region overlaps the first doped region and the second doped region, the sixth doped region overlaps the first doped region and the third doped region, the fourth doped region is between the fifth doped region and the sixth doped region, the seventh doped region is under the gate, the fifth doped region and the sixth doped region include the first type dopant, and the seventh doped region includes the second type dopant.

11. The method for forming the photosensitive device of claim 10, further comprising forming an undoped silicon layer over the germanium layer.

12. The method for forming the photosensitive device of claim 10, wherein the first type dopant is n-type dopant and the second type dopant is p-type dopant.

13. The method for forming the photosensitive device of claim 10, wherein the first type dopant is p-type dopant and the second type dopant is n-type dopant.

14. The method for forming the photosensitive device of claim 10, wherein the forming the seventh doped region in the germanium layer includes diffusing dopant from the gate into the germanium layer.

15. The method for forming the photosensitive device of claim 10, further comprising forming an eighth doped region and a ninth doped region in the germanium layer, wherein the second doped region is over the eighth doped region, the third doped region is over the ninth doped region, the first doped region is over the eighth doped region and the ninth doped region, and the eighth doped region and the ninth doped region include the second type dopant.

16. A photosensitive device comprising:
   a semiconductor substrate; and
   a germanium-based sensor having:
      a germanium layer wrapped by a doped silicon layer, wherein the doped silicon layer is between and separates a bottom of the germanium layer and the semiconductor substrate,
      a laterally-diffused photodiode having a first p-n junction and a second p-n junction disposed in the germanium layer,
      a double-gate junction field effect transistor having a first doped gate structure, a second doped gate structure, a first source/drain region disposed in the germanium layer, a second source/drain region disposed in the germanium layer, and a channel region that extends between the first source/drain region and the second source/drain region, wherein:
         the channel region extends under the first doped gate structure and the second doped gate structure;
         the first source/drain region is disposed over and connected to the first p-n junction and the second source/drain region is disposed over and connected to the second p-n junction; and
         the first doped gate structure and the second doped gate structure each include a doped conductive layer disposed over a doped region in the germanium layer.

17. The photosensitive device of claim 16, wherein the doped silicon layer is further between and separates sidewalls of the germanium layer and the semiconductor substrate.

18. The photosensitive device of claim 16, wherein the doped silicon layer is further between and separates sidewalls of the germanium layer and an oxide layer.

19. The photosensitive device of claim 16, further comprising an undoped silicon layer disposed over a top of the germanium layer and an oxide layer disposed over the undoped silicon layer, wherein the first doped gate structure and the second doped gate structure are disposed in the oxide layer and the undoped silicon layer.

20. The photosensitive device of claim 16, wherein the doped region in the germanium layer is a first doped region and the photosensitive device further comprises:
- a first passivation region disposed in the germanium layer, wherein the first passivation region is a second doped region that extends between the first source/drain region and the second source/drain region and the first doped region extends into the second doped region; and
- a second passivation region disposed in the germanium layer, wherein the second passivation region is a third doped region disposed between the first doped gate structure and the second doped gate structure and the third doped region extends into the second doped region.

* * * * *